(12) United States Patent
Hanari

(10) Patent No.: US 12,178,083 B2
(45) Date of Patent: Dec. 24, 2024

(54) DISPLAY DEVICE

(71) Applicant: Japan Display Inc., Tokyo (JP)

(72) Inventor: Jun Hanari, Tokyo (JP)

(73) Assignee: Japan Display Inc., Tokyo (JP)

( * ) Notice: Subject to any disclaimer, the term of this patent is extended or adjusted under 35 U.S.C. 154(b) by 241 days.

(21) Appl. No.: 17/392,348

(22) Filed: Aug. 3, 2021

(65) Prior Publication Data

US 2021/0367014 A1    Nov. 25, 2021

Related U.S. Application Data

(63) Continuation of application No. 16/846,490, filed on Apr. 13, 2020, now Pat. No. 11,114,516, which is a
(Continued)

(30) Foreign Application Priority Data

May 26, 2017  (JP) ................. 2017-104504

(51) Int. Cl.
*H10K 59/122* (2023.01)
*H01L 27/12* (2006.01)
(Continued)

(52) U.S. Cl.
CPC ....... *H10K 59/122* (2023.02); *H01L 27/1248* (2013.01); *H10K 50/824* (2023.02); *H10K 50/841* (2023.02); *H10K 50/8426* (2023.02); *H10K 50/844* (2023.02); *H10K 50/8445* (2023.02); *H10K 59/1213* (2023.02); *H10K 59/123* (2023.02); *H10K 59/124* (2023.02); *H10K 71/00* (2023.02); *H01L 27/124* (2013.01); *H01L 27/1255* (2013.01);
(Continued)

(58) Field of Classification Search
CPC ............. H10K 59/122; H10K 50/8426; H10K 59/131; H01L 51/5256; H01L 51/5246; H01L 27/3246; H01L 27/3276
See application file for complete search history.

(56) References Cited

U.S. PATENT DOCUMENTS

2017/0062761 A1* 3/2017 Kuriyagawa .......... H10K 59/12
2017/0287995 A1* 10/2017 Kim ...................... H10K 59/124
(Continued)

FOREIGN PATENT DOCUMENTS

KR    20180058265 A   *  6/2018

*Primary Examiner* — Aaron J Gray
(74) *Attorney, Agent, or Firm* — Michael Best & Friedrich LLP

(57) ABSTRACT

Disclosed is a display device possessing: a substrate having a display region and a peripheral region surrounding the display region; a pixel over the display region; a passivation film over the pixel; a resin layer over the passivation film; a first dam over the peripheral region and surrounding the display region; and a second dam surrounding the first dam. The passivation film includes; a first layer containing an inorganic compound; a second layer over the first layer, the second layer containing an organic compound; and a third layer over the second layer, the third layer containing an inorganic compound. The second layer is selectively arranged in a region surrounded by the first dam. The resin layer is selectively arranged in a region surrounded by the second dam.

16 Claims, 25 Drawing Sheets

Related U.S. Application Data continuation of application No. 15/954,694, filed on Apr. 17, 2018, now Pat. No. 10,658,439.

(51) Int. Cl.
  *H10K 50/824* (2023.01)
  *H10K 50/84* (2023.01)
  *H10K 50/842* (2023.01)
  *H10K 50/844* (2023.01)
  *H10K 59/12* (2023.01)
  *H10K 59/121* (2023.01)
  *H10K 59/123* (2023.01)
  *H10K 59/124* (2023.01)
  *H10K 71/00* (2023.01)
  *H10K 59/131* (2023.01)
  *H10K 102/00* (2023.01)

(52) U.S. Cl.
  CPC ..... *H10K 59/1201* (2023.02); *H10K 59/1216* (2023.02); *H10K 59/131* (2023.02); *H10K 2102/311* (2023.02)

(56) References Cited

U.S. PATENT DOCUMENTS

| | | | |
|---|---|---|---|
| 2017/0323936 A1* | 11/2017 | Lee | H10K 59/1216 |
| 2018/0061918 A1* | 3/2018 | Park | H10K 59/123 |
| 2018/0145127 A1* | 5/2018 | Shin | H10K 59/1315 |
| 2018/0158741 A1* | 6/2018 | Kim | H01L 22/32 |
| 2018/0287093 A1* | 10/2018 | Lee | H10K 59/122 |
| 2020/0350519 A1* | 11/2020 | Sasaki | H10K 59/126 |

* cited by examiner

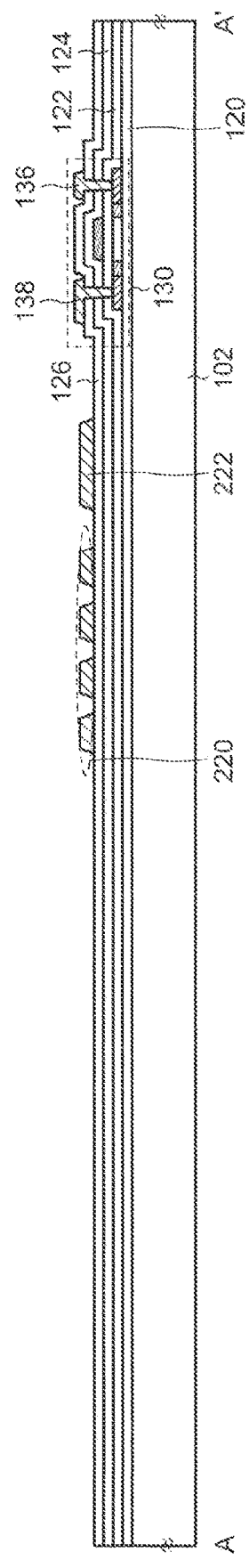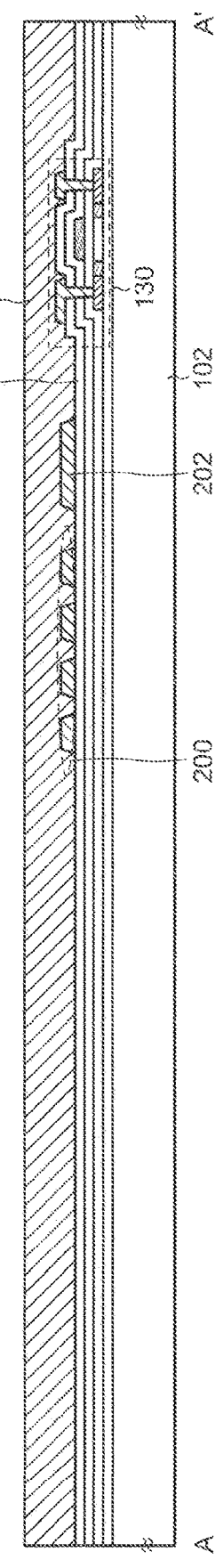

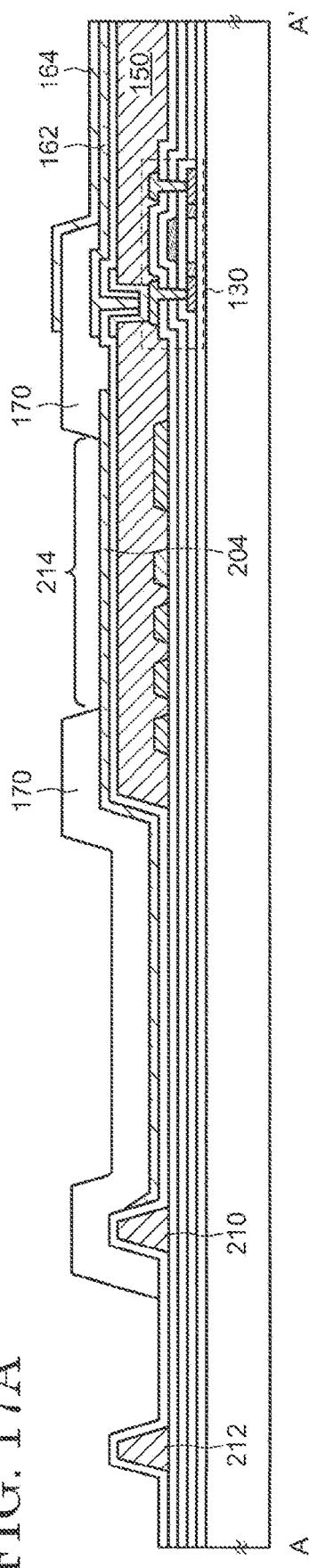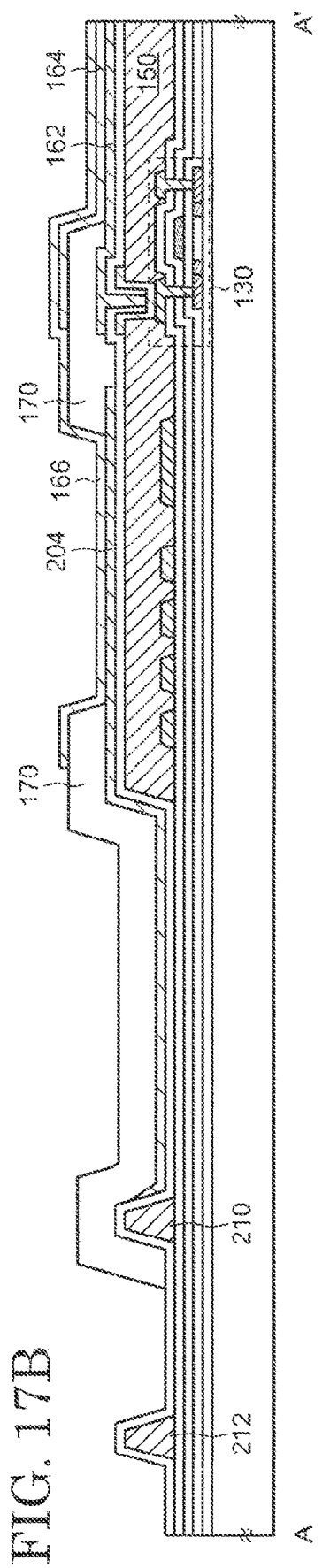

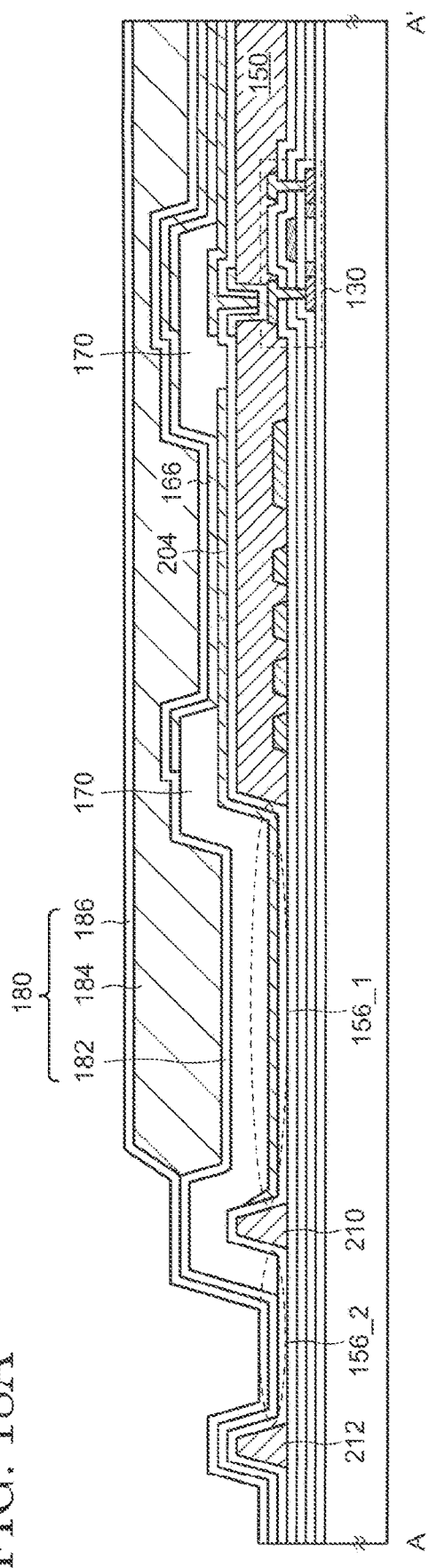
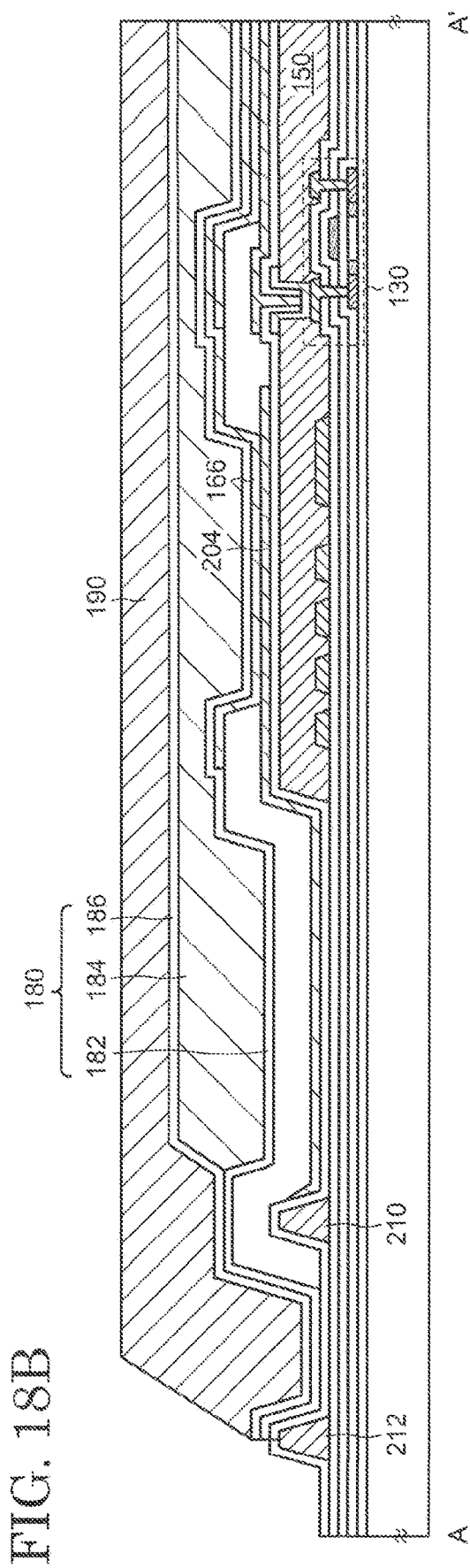
FIG. 18A
FIG. 18B

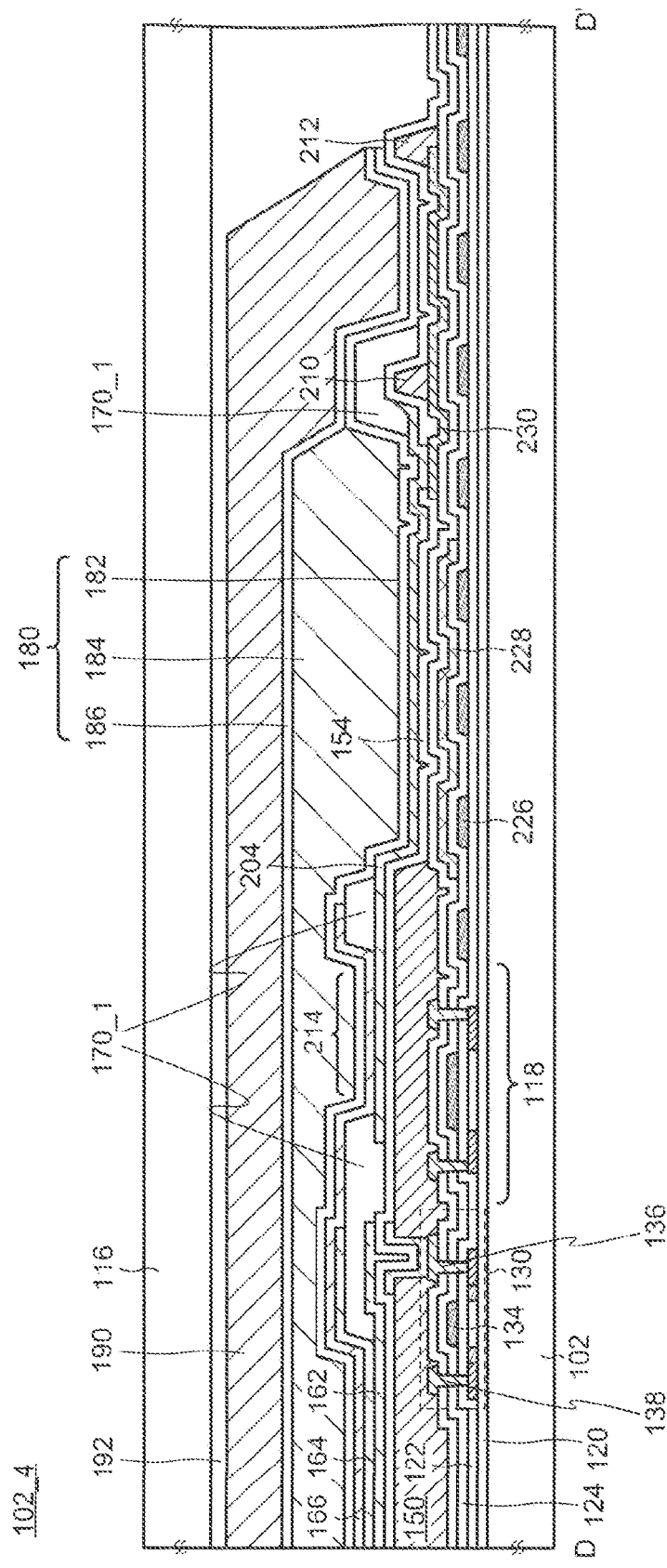

DISPLAY DEVICE

CROSS REFERENCE TO RELATED APPLICATIONS

This application is a continuation of U.S. patent application Ser. No. 16/846,490 filed on Apr. 13, 2020, which, in turn, is a continuation of U.S. Patent Application Ser. No. 15/954,694 (now U.S. Pat. No. 10,658,439) filed on Apr. 17, 2018. Further, this application is based on and claims the benefit of priority from the prior Japanese Patent Application No. 2017-104504, filed on May 26, 2017, the entire contents of which are incorporated herein by reference.

FIELD

The present invention relates to a display device and a manufacturing method of the display device. For example, the present invention relates to a display device having an organic light-emitting element in each pixel and a manufacturing method thereof.

BACKGROUND

An organic EL (Electroluminescence) display device has been known as a typical example of a display device. An organic EL display device has an organic light-emitting element (hereinafter, referred to as a light-emitting element) in each of multiple pixels formed over a substrate. A light-emitting element has a layer containing an organic compound (hereinafter, referred to as an EL layer or an organic layer) between a pair of electrodes and is operated by supplying current between the pair of electrodes. During operation of the light-emitting element, the organic compound is oxidized or reduced to exist in a charged state which further undergoes recombination to generate an excited state. Since such an active species in a charged state or an excited state has higher reactivity than a compound in an electrically neutral state or a ground state thereof, the active species reacts with another organic compound or readily reacts with impurities entering the light-emitting element, such as water and oxygen. Products resulting from these reactions influence the properties of the light-emitting element and cause reduction in efficiency and lifetime of the light-emitting element.

Japanese Patent Application Publication No. 2015-15089 discloses, as a method for suppressing deterioration in such properties, forming a region (shielding region) for blocking impurities between a display region including light-emitting elements and a peripheral region surrounding the display region. The formation of the shielding region effectively prevents impurities from entering particularly from an edge portion of a substrate, which improves reliability of a display device.

SUMMARY

An embodiment of the present invention is a display device. This display device possesses: a substrate having a display region and a peripheral region surrounding the display region; a pixel over the display region; a passivation film over the pixel, a resin layer over the passivation film; a first dam over the peripheral region and surrounding the display region; and a second dam surrounding the first dam. The passivation film includes; a first layer containing an inorganic compound; a second layer over the first layer, the second layer containing an organic compound; and a third layer over the second layer, the third layer containing an inorganic compound. The second layer is selectively arranged in a region surrounded by the first dam. The resin layer is selectively arranged in a region surrounded by the second dam.

An embodiment of the present invention is a display device. This display device possesses: a substrate having a display region and a peripheral region surrounding the display region; a pixel over the display region; and an auxiliary wiring over the peripheral region and surrounding the display region. The pixel includes a light-emitting element having a pixel electrode, an opposing electrode, an organic layer sandwiched by the pixel electrode and the opposing electrode and a partition wall covering an edge portion of the pixel electrode. The pixel electrode and the auxiliary wiring have the same stacked-layer structure, and the auxiliary wiring and the opposing electrode are electrically connected to each other. The partition wall extends from the display region to the peripheral region and covers a first edge portion and a second edge portion of the auxiliary wiring, the second edge portion opposing the first edge portion.

An embodiment of the present invention is a display device. This display device possesses: a substrate having a display region and a peripheral region surrounding the display region; a pixel over the display region; and a first dam over the peripheral region and surrounding the display region. The pixel includes: a transistor; a leveling film over the transistor; a light-emitting element over the leveling film, the light-emitting element including a pixel electrode, an opposing electrode, and an organic layer between the pixel electrode and the opposing electrode; and a partition wall covering an edge portion of the pixel electrode and sandwiched between the pixel electrode and the organic layer. The partition wall extends to the peripheral region and overlaps with the first dam.

BRIEF DESCRIPTION OF DRAWINGS

FIG. 15A and FIG. 15B are schematic cross-sectional views for explaining a manufacturing method of a display device according to an embodiment of the present invention;

FIG. 17A and FIG. 17B are schematic cross-sectional views for explaining a manufacturing method of a display device according to an embodiment of the present invention;

FIG. 18A and FIG. 18B are schematic cross-sectional views for explaining a manufacturing method of a display device according to an embodiment of the present invention;

FIG. 21 is a schematic cross-sectional view of a display device according to an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the films may have functions or roles different from each other. However, the films each originate from a film formed as the same layer in the same process and has the same layer structure and the same material. Therefore, the films are defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the present specification and claims, an expression "a structural body is exposed from another structural body" means an aspect where a portion of the structural body is not covered by the other structural body and includes an aspect where the portion which is not covered by the other structural body is covered by yet another structural body.

First Embodiment

1. Outline Structure

Figure 1:
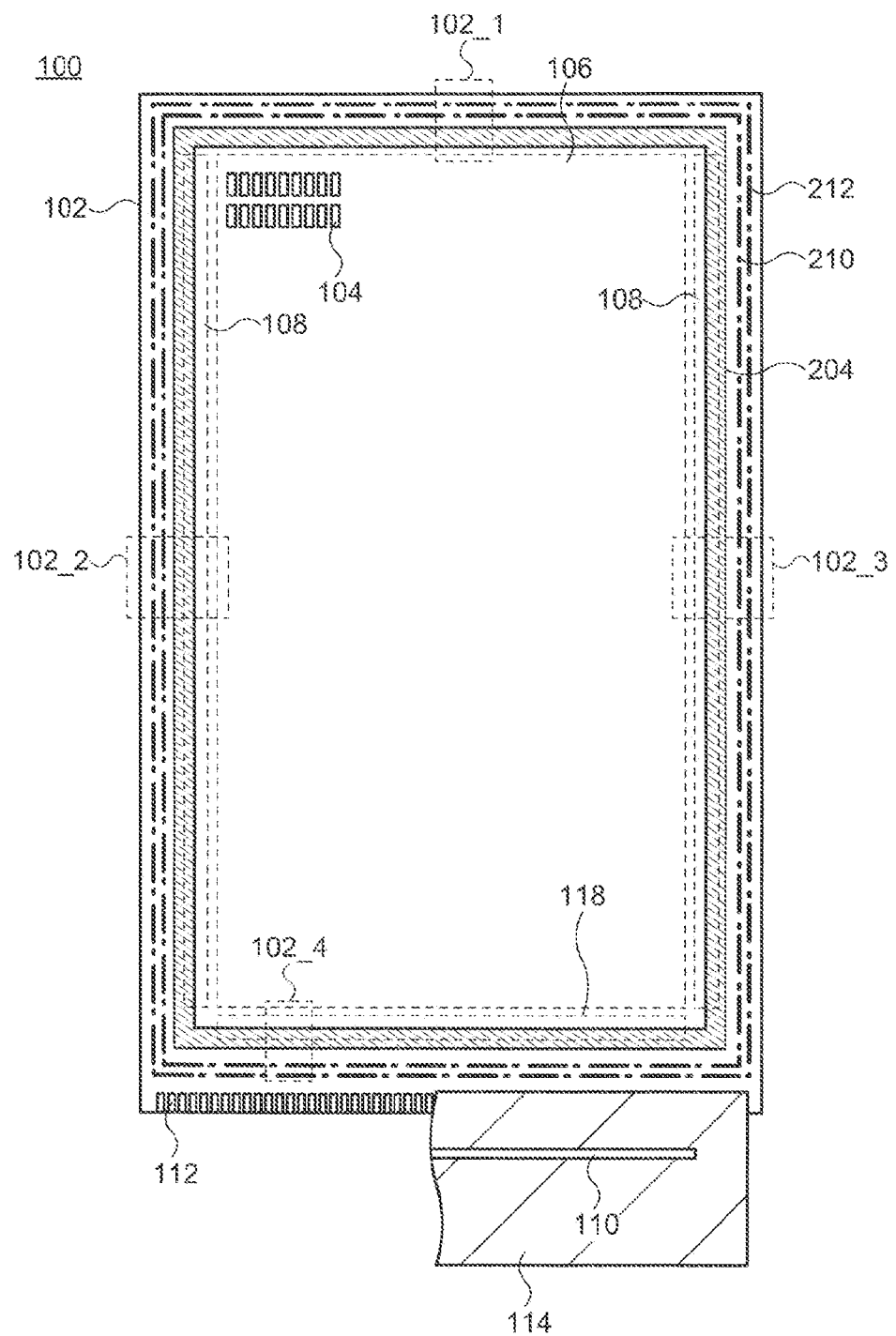
FIG. 1 is a schematic top view of a display device according to an embodiment of the present invention.

A schematic top view of a display device 100 of an embodiment of the present invention is shown in FIG. 1. The display device 100 includes a light-emitting element as a display element.

As shown in FIG. 1, the display device 100 has a substrate 102 over which a plurality of pixels 104 is provided. A region in which the pixels 104 are disposed and a region surrounding this region are respectively defined as a display region 106 and a peripheral region of the substrate 102. Driver circuits for driving the pixels 104 are formed in the peripheral region. In the example shown in FIG. 1, two gate-side driver circuits 108 sandwiching the display region 106 and a source-side driver circuit 118 including analogue switches and the like are provided. Wirings which are not illustrated extend from the display region 106, the gate-side driver circuits 108, and the source-side driver circuit 118 to a side of the substrate 102 and are exposed at an edge portion of the substrate 102 to form terminals 112. The terminals 112 are electrically connected to a connector 114 such as a flexible printed circuit (FPC) substrate. A driver IC 110 for controlling the pixels 104 may be further mounted over the connector 114 or the substrate 102. Note that the source-side driver circuit 118 may not be provided over the peripheral region, and functions thereof may be realized by the driver IC 110. A light-emitting element 160 is disposed in each pixel 104 and controlled with the gate-side driver circuits 108, a source-side driver circuit 118, and the like, by which an image can be displayed on the display region 106.

As described below in detail, the display device 100 possesses, in the peripheral region, an auxiliary wiring 204 surrounding the display region 106. As shown in FIG. 1, the auxiliary wiring 204 may continuously surround the display region 106. The display device 100 further possesses a barrier wall (hereinafter, referred to as a dam) provided in the peripheral region so as to surround the auxiliary wiring 204. Specifically, the display device 100 has a first dam 210 continuously surrounding the display region 106 and the auxiliary wiring 204 and a second dam 212 surrounding the first dam 210.

2. Pixel 2-1. Pixel Circuit

Figure 2A:
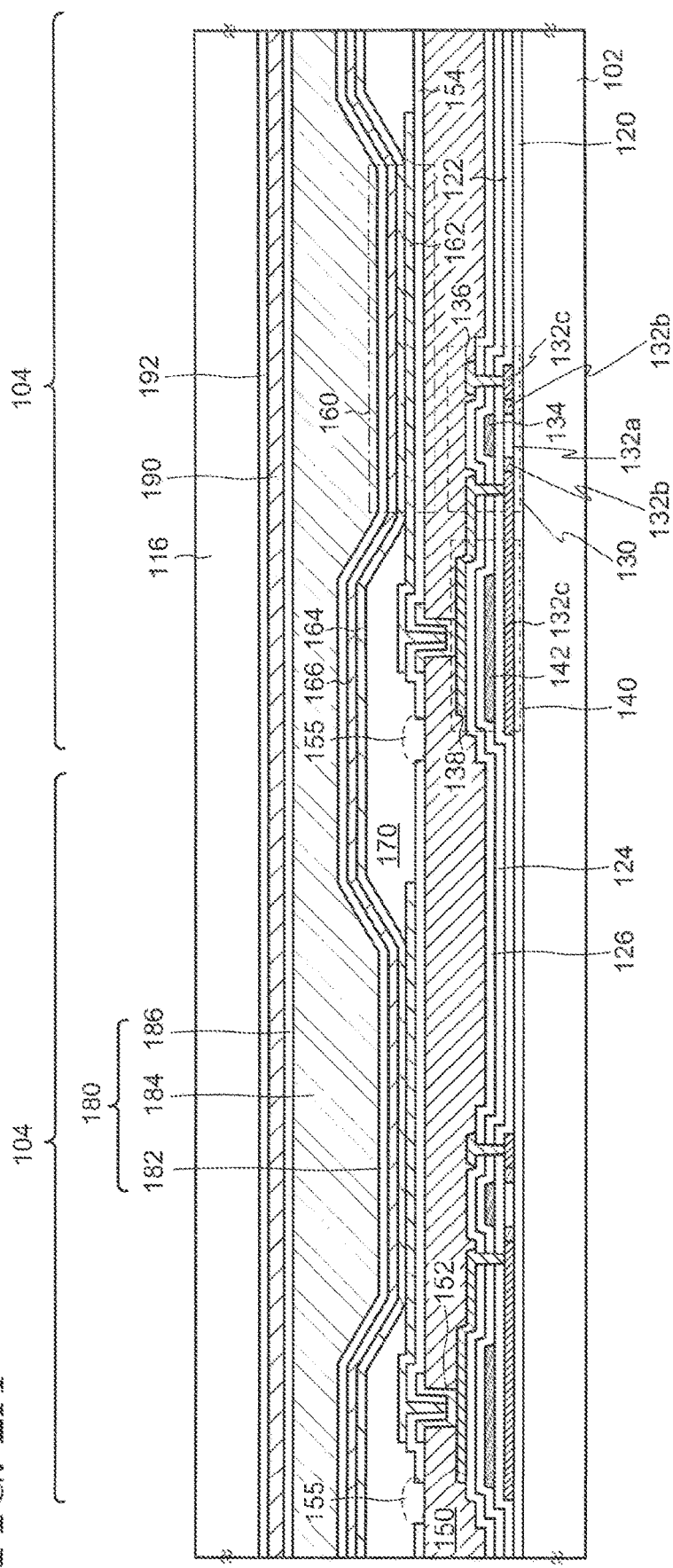
FIG. 2A and FIG. 2B are schematic cross-sectional views of a display device according to an embodiment of the present invention.

A schematic cross-sectional view of two adjacent pixels 104 is shown in FIG. 2A. A pixel circuit including a variety of elements such as a transistor and a capacitor element is formed in each pixel 104 in addition to the light-emitting element 160. The number and the connection relationship of these elements are not limited. The light-emitting element 160 as well as a storage capacitor 140 and a transistor 130 connected to the light-emitting element 160 are illustrated in FIG. 2A as an example. The pixel circuit and the light-emitting element 160 are arranged between the substrate 102 and an opposing substrate 116.

The transistor 130 and the storage capacitor 140 are provided over the substrate 102 with an undercoat 120 sandwiched therebetween. The substrate 102 has a function to support the circuits formed thereover and may include glass, quartz, or a polymer. The use of a polymer such as a polyimide, a polyamide, and a polycarbonate for the substrate 102 and the opposing substrate 116 provides flexibility to the display device 100, allowing production of a so-called flexible display. The undercoat 120 is an insulating film formed for preventing diffusion of impurities originating from the substrate 102.

The transistor 130 possesses a semiconductor film 132, a gate insulating film 122 over the semiconductor film 132, a gate electrode 134 over the gate insulating film 122, a first interlayer film 124 over the gate electrode 134, a second interlayer film 126 over the first interlayer film 124, source/drain electrodes 136 and 138 over the second interlayer film 126, and the like. The semiconductor film 132 may have an active region 132a, low-concentration impurity regions 132b sandwiching the active region 132a, high-concentration impurity regions 132c sandwiching these regions, and the like. Although the transistor 130 is illustrated as a transistor having a top-gate structure in FIG. 2A, the structure of the transistors structuring the pixel circuit is not limited, and transistors with a variety of structures may be utilized. Note that the second interlayer film 126 is an optional structure and may be omitted.

The storage capacitor 140 is composed of a part of the semiconductor film 132 (high-concentration impurity region 132c), the gate insulating film 122 thereover, a capacitor electrode 142 existing in the same layer as the gate electrode 134, the first interlayer film 124 over the capacitor electrode 142, the second interlayer film 126, and a part of the source/drain electrode 138. Here, the gate insulating film 122, the first interlayer film 124, and the second interlayer film 126 function as a dielectric of the storage capacitor 140. An inorganic compound containing silicon may be used for the undercoat 120, the gate insulating film 122, the first interlayer film 124, and the second interlayer film 126, for example. As an inorganic compound containing silicon, silicon oxide containing oxygen and silicon as well as silicon nitride, silicon oxynitride, and silicon nitride oxide containing oxygen, silicon, and nitrogen, and the like are exemplified. These films may have a single-layer structure or a stacked-layer structure.

A leveling film 150 is further formed over the transistor 130 and the storage capacitor 140. Depressions and projections caused by the pixel circuit including the transistor 130 and the storage capacitor 140 are absorbed by the leveling film 150, giving a flat surface. The leveling film 150 may contain a polymer exemplified by an acrylic resin, an epoxy resin, a polysiloxane, a polyimide, a polyamide, and the like. Although not illustrated, an insulating film containing an inorganic compound may be disposed, as an optional structure, between the leveling film 150 and the source/drain electrodes 136 and 138 as an interlayer film.

An opening reaching the source/drain electrode 138 is formed in the leveling film 150, and a connection electrode 152 covering this opening and a part of the leveling film 150 is provided so as to be in contact with the source/drain electrode 138. A third interlayer film 154 is further formed so as to cover the connection electrode 152. The third interlayer film 154 is also an insulating film. The silicon-containing inorganic compounds described above can be used for the third interlayer film 154, and silicon nitride is typically employed. The third interlayer film 154 does not cover a part of the connection electrode 152 in the opening formed in the leveling film 150 to allow a top surface of the connection electrode 152 to be exposed. This structure enables electrical connection between the connection electrode 152 and a pixel electrode 162 formed thereover. An opening 155 may be formed in the third interlayer film 154 to allow contact of a partition wall (also called rib or bank) 170 formed thereover with the leveling film 150. Note that the formation of the connection electrode 152 and the opening 155 is optional. The formation of the connection electrode 152 prevents oxidation of a surface of the source/drain electrode 138 in the following processes, thereby suppressing an increase in contact resistance due to the oxidation. The opening 155 functions as an opening to release impurities from the leveling film 150, such as water and oxygen, and the formation of the opening 155 improves reliability of the semiconductor elements in the pixel circuit and the light-emitting element 160.

The pixel electrode 162 is formed over the third interlayer film 154 so as to cover the connection electrode 152. The pixel electrode 162 is electrically connected to the source/drain electrode 138 through the connection electrode 152 in the opening formed in the leveling film 150.

2-2. Light-Emitting Element

Figure 2B:
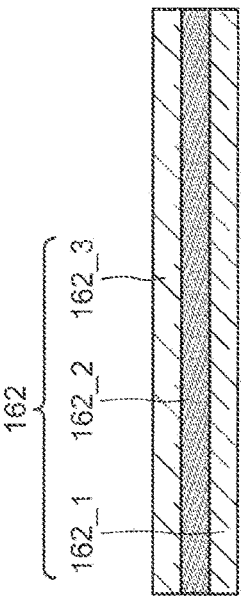

The pixel electrode 162 may include a conductive material exhibiting a transmitting property with respect to visible light, a metal such as silver and aluminum, or an alloy including at least one metal selected from these metals. The pixel electrode 162 may have a single-layer structure or a stacked-layer structure. In the case of a stacked-layer structure, a structure may be employed in which a first conductive layer 162_1, a second conductive layer 162_2 over the first conductive layer 162_1, and a third conductive layer 162_3 over the second conductive layer 162_2 are stacked in this order as shown in FIG. 2B, for example.

The first conductive layer 162_1 has a transmitting property with respect to visible light and may include a mixed oxide of indium and tin (ITO), a mixed oxide of indium and zinc (IZO), or the like. The first conductive layer 162_1 more firmly fixes the second conductive layer 162_2 over the third interlayer film 154. The second conductive layer 162_2 preferably has a high reflectance with respect to visible light and may include 0-valent silver, 0-valent aluminum, 0-valent magnesium, or an alloy including a metal selected from these metals. A thickness of the second conductive layer 162_2 may be equal to or more than 100 nm and equal to or less than 200 nm, equal to or more than 120 nm and equal to or less than 160 nm, or equal to or more than 120 nm and equal to or less than 140 nm and is typically 130 nm. Since such a thickness inhibits visible light from passing therethrough, the second conductive layer 162_2 exhibits a high reflectance. Therefore, light emission obtained from the light-emitting element 160 is efficiently reflected and can be extracted through the opposing substrate 116. Additionally, the formation of the second conductive layer 162_2 with such a thickness results in a sufficiently low electrical resistance. The third conductive layer 162_3 has a transmitting property with respect to visible light and may typically contain ITO or IZO. Since ITO and IZO have a relatively high work function, holes can be efficiently injected to an organic layer 164 when the pixel electrode 162 is allowed to function as an anode.

The organic layer 164 and an opposing electrode 166 thereover are provided so as to cover the pixel electrode 162 and the partition wall 170. The light-emitting element 160 is formed by the pixel electrode 162, the organic layer 164, and the opposing electrode 166. In the present specification and claims, the organic layer 164 means all of the layers disposed between the pixel electrode 162 and the opposing electrode 166. Carriers (holes and electrons) are injected to the organic layer 164 from the pixel electrode 162 and the opposing electrode 166, and emission is obtained through a radiative decay process of an excited state generated by recombination of the carriers.

Although the organic layer 164 is illustrated so as to have a single-layer structure in FIG. 2A, the organic layer 164 may be composed of a plurality of layers and may be formed by combining layers having a variety of functions, such as a carrier-injection layer, a carrier-transporting layer, an emission layer, a carrier-blocking layer, and an exciton-blocking layer. The structure of the organic layer 164 may be the same in all of the pixels 104, or the organic layer 164 may be configured so that the structure thereof is different between adjacent pixels 104. For example, the organic layer 164 is formed so that a structure or a material of the emission layer is different between adjacent pixels 104, by which light emissions with different colors are attenable from adjacent pixels 104. When the same organic layer 164 is used in all of the pixels 104, a plurality of emission colors can be obtained by using a color filter on the opposing substrate 116.

The opposing electrode 116 is formed across the plurality of pixels 104. That is, the opposing electrode 166 is shared by the plurality of pixels 104. The opposing electrode 166 exhibits a transmitting property with respect to visible light and may be formed by using a conductive oxide having a light-transmitting property, such as ITO and IZO. Alternatively, the opposing electrode 166 may be formed by forming a film including silver, aluminum, magnesium, or an alloy containing a metal selected from these metals at a thickness which allows visible light to pass therethrough.

2-3. Other Structures

A protection film (hereinafter, referred to as a passivation film) 180 for protecting the light-emitting elements 160 is provided over the light-emitting elements 160. The structure of the passivation film 180 may be arbitrarily selected, and a stacked-layer having a first layer 182 containing an inorganic compound, a second layer 184 containing an organic compound, and a third layer 186 containing an inorganic compound may be applied to the passivation film 180 as shown in FIG. 2A. In this case, the above-described inorganic compounds containing silicon may be used as an inorganic compound. A polymer material such as an epoxy resin or an acrylic resin may be used as an organic compound.

The second layer 184 may have a relatively large thickness, by which depressions and projections caused by the partition wall 170 are absorbed to provide a flat top surface, and the third layer 186 can be formed thereover. Hence, planarity of the third layer 186 is improved, and generation of a crack or a pinhole in the third layer 186 can be prevented, thereby effectively suppressing entrance of impurities.

A resin layer 190 is provided over the passivation film 180. The resin layer 190 is a layer used as a mask to expose the terminals 112 by removing, with an etching treatment, the first layer 182 and the third layer 186 formed over the terminals 112 and has a function to protect the passivation film 180 in the etching treatment. The resin layer 190 includes a polymer material such as an acrylic resin or an epoxy resin.

An opposing substrate 116 is fixed to the substrate 102 with an adhesive layer 192 composed of an organic material so as to sandwich the light-emitting element 160 and the pixel circuit, by which the light-emitting element 160 and the pixel circuit are sealed. Although not illustrated, a touch sensor may be fabricated between the passivation film 180 and the resin layer 190.

3. Peripheral Region

As described above, the display device 100 possesses the auxiliary wiring 204 as well as the first dam 210 and the second dam surrounding the auxiliary wiring 204 in the peripheral region. The structures thereof are described below.

3-1. Structure of Upper Side of Substrate

Figure 3A:
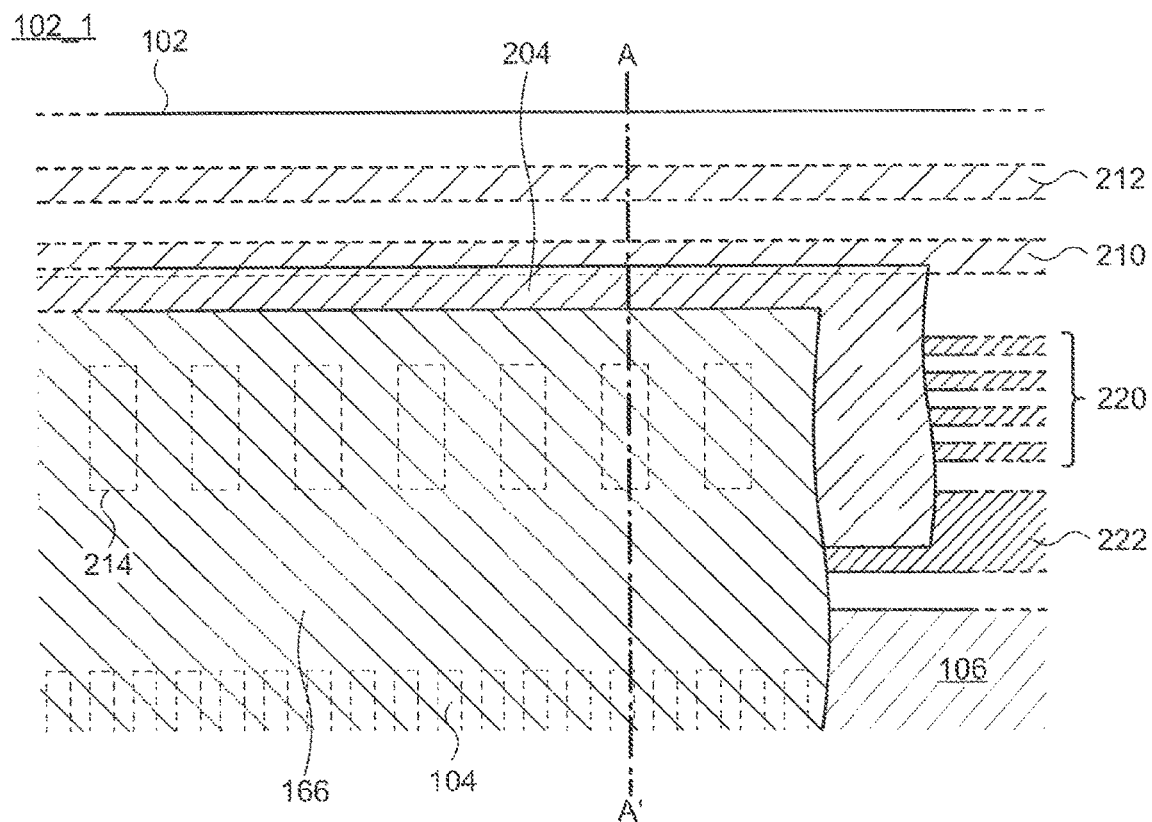
FIG. 3A and FIG. 3B are schematic top views of a display device according to an embodiment of the present invention.
Figure 4:
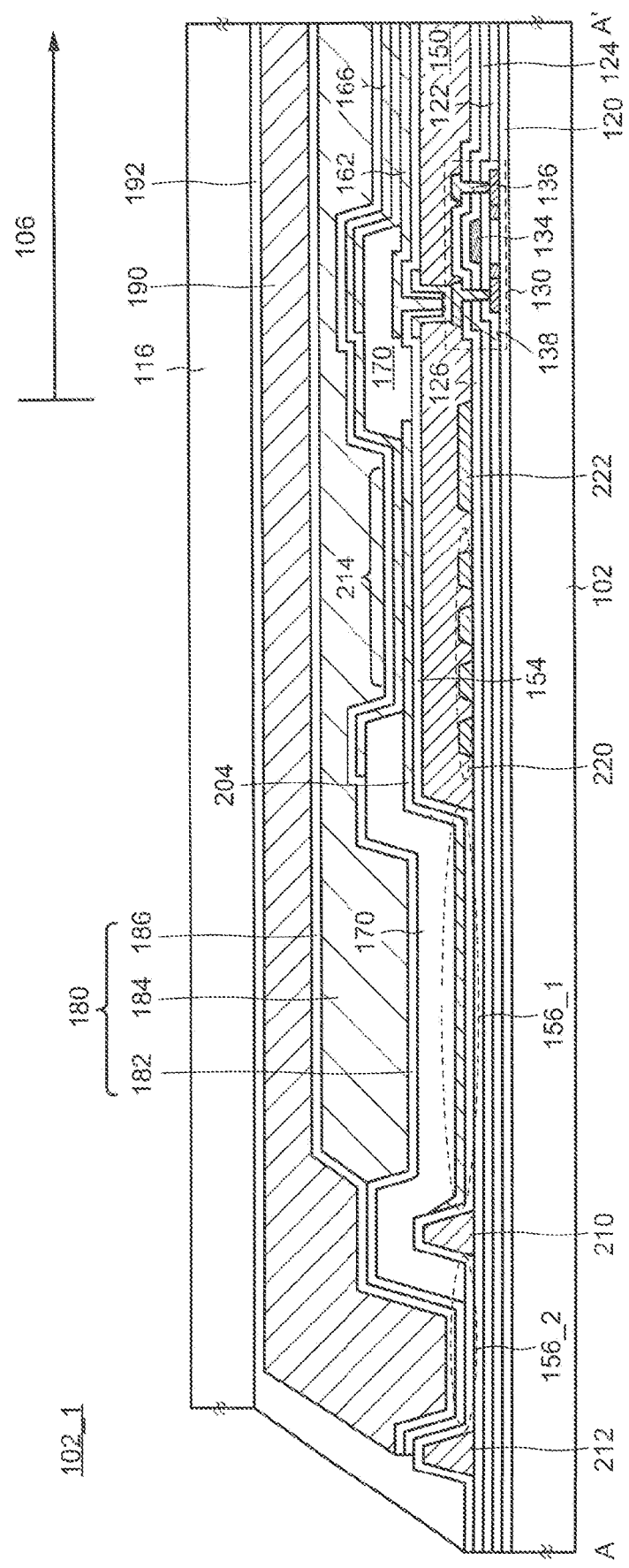
FIG. 4 is a schematic cross-sectional view of a display device according to an embodiment of the present invention.

A schematic top view of the peripheral region and the display region 106 (region 102_1 in FIG. 1) close to a side (hereinafter, referred to as an upper side or first side) of the substrate 102 opposing a side along which the terminals 112 are arranged is shown in FIG. 3A, and a schematic view of a cross section along a chain line A-A' in FIG. 3A is shown in FIG. 4. As shown in FIG. 3A and FIG. 4, wirings 220 and 222 extending substantially parallel to the upper side of the substrate 102 are disposed in the peripheral region between the display region 106 and the upper side of the substrate 102. The number, usage, and function of the wirings 220 and 222 are not limited. For example, the wirings 220 and 222 each may function as a power-source line for supplying a constant potential to the pixel electrodes 162 or a signal line to transmit a variety of signals to the driver circuits. An example is shown in FIG. 4 in which the wirings 220 and 222 exist in the same layer as the source/drain electrodes 136 and 138. However, the wirings 220 and 222 may exist in the same layer as the gate electrode 134.

The leveling film 150 provided in the pixels 104 also extends in a direction toward the upper side of the substrate 102 to cover the wirings 220 and 222 (FIG. 4). However, the leveling film 150 is partly removed in the peripheral region, and the first dam 210 and the second dam 212 are formed by the remaining leveling film 150. Therefore, the first dam 210, the second dam 212, and the leveling film 150 have the same composition as one another and are spaced from one another.

The third interlayer film 154 is spaced from the second interlayer film 126 (from the first interlayer film 124 in the case where the second interlayer film 126 is not provided) in the display region 106. However, there are regions (hereinafter, shielding region) 156 in which the third interlayer film 154 is in contact with the second interlayer film 126 or the first interlayer film 124 in the peripheral region. At least two shielding regions 156 are provided, and the first dam 210 existing in the same layer as the leveling film 150 is positioned between these two shielding regions 156_1 and 156_2. Furthermore, the second dam 212 existing in the same layer as the leveling film 150 is positioned between the shielding region 156_2 and the upper side of the substrate 102. Hence, the shielding region 156_2 is a region sandwiched by the first dam 210 and the second dam 212, and the shielding region 156_1 is a region sandwiched by the first dam 210 and the leveling film 150.

The auxiliary wiring 204 existing in the same layer as the pixel electrode 162 is further provided in the peripheral region. The auxiliary wiring 204 may be formed so as to overlap with the wirings 220 and 222 or the leveling film 150. Although the pixel electrodes 162 and the auxiliary wiring 204 are not in physical contact with each other, they are able to have the same stacked-layer structure because they can be formed in the same process. For example, the auxiliary wiring 204 may have the structure in which the first conductive layer 162_1, the second conductive layer 162_2, and the third conductive layer 162_3 are stacked in this order as shown in FIG. 2B.

Figure 5:
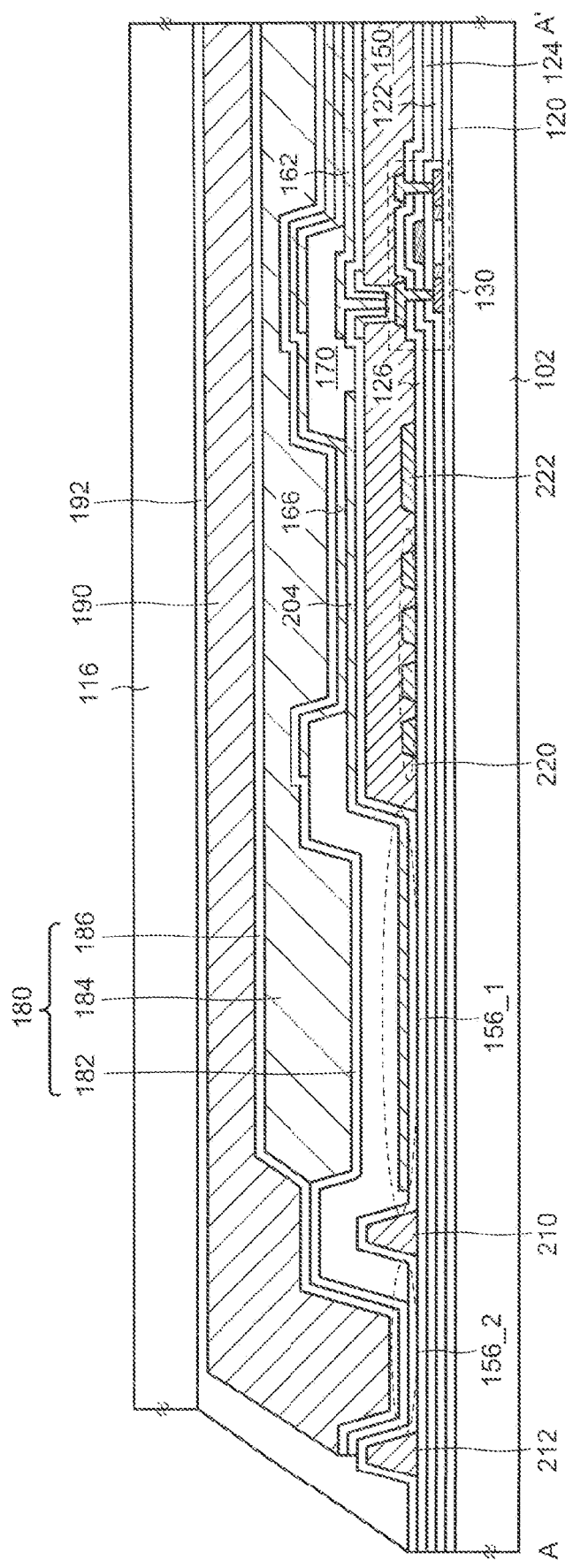
FIG. 5 is a schematic top view of a display device according to an embodiment of the present invention.

Here, a part of the auxiliary wiring 204 is also located in the shielding region 156_1 as shown in FIG. 4. Moreover, an edge portion of the auxiliary wiring 204 (an edge portion opposite to the display region 106. Hereinafter, referred to as a first edge portion) may overlap with the first dam 210. That is, the auxiliary wiring 204 may be arranged so that the first edge portion overlaps with a sidewall of the first dam 210. Alternatively, the first edge portion of the auxiliary wiring 204 may not overlap with the sidewall of the first dam 210 but may be located between the first dam 210 and the leveling film 150 as shown in FIG. 5.

As shown in FIG. 4, the partition wall 170 is located not only in the display region 106 but in the peripheral region, and a part thereof overlaps with the shielding region 156_1 and covers the first dam 210. More specifically, as can be understood from FIG. 2A, FIG. 3A, and FIG. 4, the partition wall 170 has a plurality of openings overlapping with the pixel electrodes 162 in the display region 106 to allow the pixel electrodes 162 to be in contact with the organic layer 164. In addition, the partition wall 170 not only covers an edge portion (an edge portion on a side of the display region 106. Hereinafter, referred to as a second edge portion) of the auxiliary wiring 204 opposing the first edge portion but also has a plurality of openings 214 overlapping with the auxiliary wiring 204 in the peripheral region. The opposing electrode 166 is electrically connected to the auxiliary wiring 204 through the openings 214. The auxiliary wiring 204 is applied with a constant potential and connected to a periphery of the opposing electrode 166 as described below. Therefore, a constant potential can be maintained in the whole of the opposing electrode 166.

As shown in FIG. 4, a top surface of the auxiliary wiring 204 can be covered with the partition wall 170 in the shielding region 156_1. A depression or a projection is readily formed on the top surface of the auxiliary wiring 204, particularly on the top surface of the edge portion thereof. Therefore, when the auxiliary wiring 204 is in contact with the first layer 182 of the passivation film 180, a pinhole is readily generated in the first layer 182. However, it is possible to prevent the generation of a pinhole by covering the top surface of the auxiliary wiring 204 with the partition wall 170. Note that, it is not always necessary that the partition wall 170 cover the whole of the top surface of the auxiliary wiring 204, and the partition wall 170 may selectively cover the first edge portion of the auxiliary wiring 204 and the second edge portion to allow the top surface other than these edge portions to be in contact with the first layer 182.

Figure 3B:
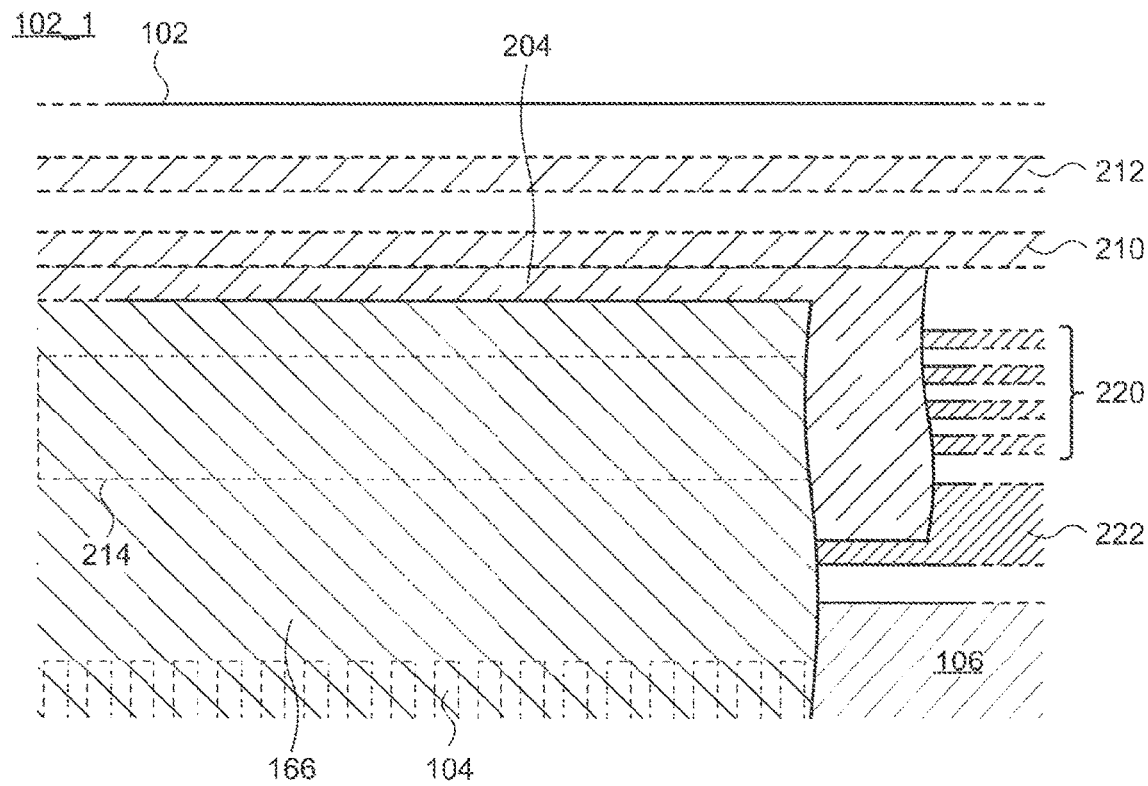

In the example shown in FIG. 3A, the plurality of openings 214 is used for electrical connection between the opposing electrode 166 and the auxiliary wiring 204. However, the number of the openings 214 is not limited, and a single opening 214 extending parallel to the upper side may be formed to connect the opposing electrode 166 to the auxiliary wiring 204 as shown in FIG. 3B.

The first layer 182 and the third layer 186 of the passivation film 180 are provided so as to overlap with the first dam 210 and the second dam 212. On the other hand, the second layer 184 is selectively arranged over the display region 106 and the peripheral region surrounded by the first dam 210. Alternatively, the second layer 184 is arranged so as to overlap with the sidewall of the first dam 210 but not to cross over the first dam 210.

The resin layer 190 is provided over the passivation film 180 and is formed so that the second layer 184 is confined by the resin layer 190 and the first layer 182. Therefore, an edge portion of the resin layer 190 is farther from the display region 106 and closer to the upper side of the substrate 102 compared with that of the second layer 184. Note that although the resin layer 190 overlaps with the sidewall of the second dam 212, the resin layer 190 is arranged so as not to cross over the second dam 212.

The resin layer 190 and the opposing substrate 116 are fixed to each other with the adhesive layer 192. As shown in FIG. 4, the adhesive layer 192 may be disposed so as to cover a side surface of the resin layer 190 and an outer side of the second dam 212 (an opposite side with respect to the display region 106).

As described above, the resin layer 190 is selectively provided in the region surrounded by the second dam 212, while the passivation film 180 is selectively provided in the region surrounded by the first dam 210. Hence, when etching is carried out by using the resin layer 190 as a mask, the passivation film 180 is protected by the resin layer 190. As a result, it is possible to prevent damage of the passivation film 180 and maintain the high sealing ability of the passivation film 180.

Additionally, the first edge portion and the second edge portion of the auxiliary wiring 204 are covered by the partition wall 170. Hence, deterioration of the edge portions of the auxiliary wiring 204 and entrance of impurities from the edge portions of the auxiliary wiring 204 can be prevented, which enables production of a display device with high reliability.

As described in the Second Embodiment, the opposing electrode 166 can be formed by evaporatively depositing a metal such as silver and magnesium, and a shape thereof is controlled by using a metal mask. However, it is relatively difficult to precisely control a position of an edge portion of the opposing electrode 166 because, when a metal film is prepared with a metal mask, metal vapor readily reaches outside an opening of a metal mask. Hence, a part of the opposing electrode 166 may be formed outside a region covered by the passivation film 180 depending on alignment accuracy of a metal mask or conditions of evaporation. In this case, the edge portion of the opposing electrode 166 is not protected by the passivation film 180, which allows water and oxygen to enter from outside, leading to deterioration of the light-emitting element 160.

In addition, the metal (e.g., an alloy of silver and magnesium) used for the second conductive layer 162_2 of the auxiliary wiring 204 relatively readily transmits water and oxygen and causes deterioration of the light-emitting element 160. However, the shape thereof can be accurately controlled because the auxiliary wiring 204 is prepared by utilizing photolithography using a resist mask.

Hence, as demonstrated by the structure described above, the formation of the openings 214 on a side of the second edge of the auxiliary wiring 204 significantly decreases the possibility that the edge portion of the opposing electrode 166 reaches the region which is not covered by the passivation film 180. Accordingly, the problems described above can be avoided, and high reliability can be provided to the display device 100.

3-2. Structure of Long Side of Substrate

The structure of the peripheral region and the display region 106 (regions 102_2 and 102_3 in FIG. 1) close to the sides (hereinafter, referred to as long sides or second and third sides) perpendicular to the upper side of the substrate 102 is explained below. An explanation of the structure the same as those described above may be omitted.

Figure 7:
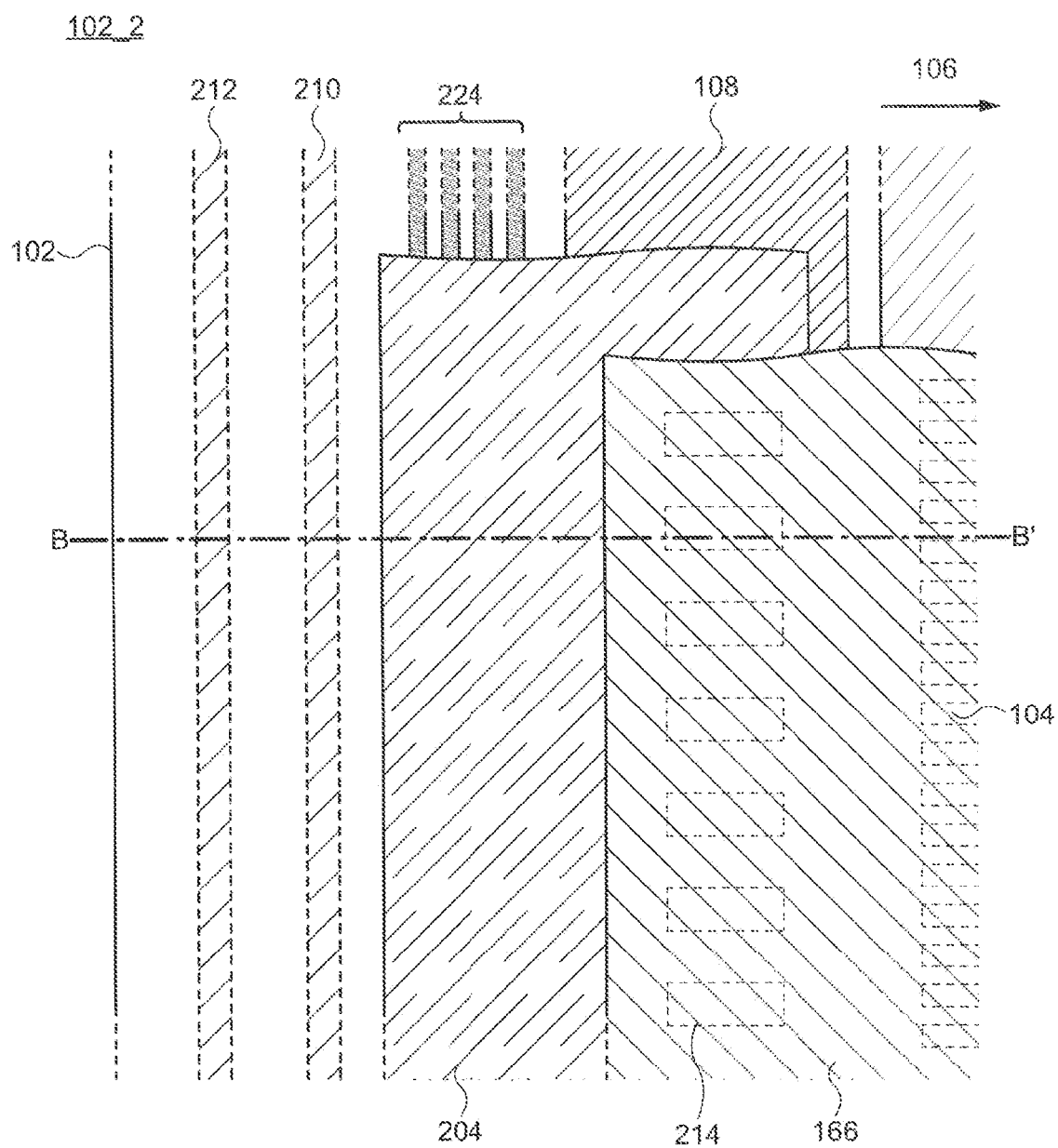
FIG. 7 is a schematic top view of a display device according to an embodiment of the present invention.
Figure 8:
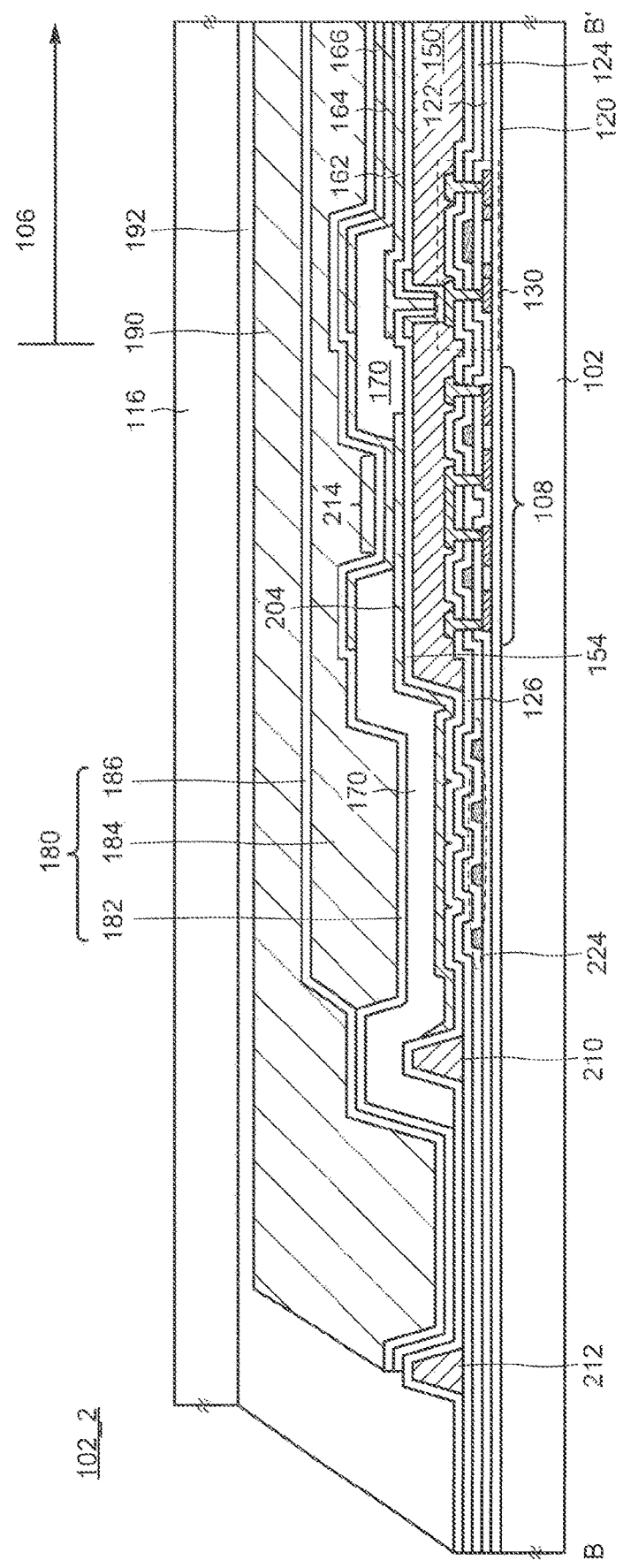
FIG. 8 is a schematic cross-sectional view of a display device according to an embodiment of the present invention.
Figure 9:
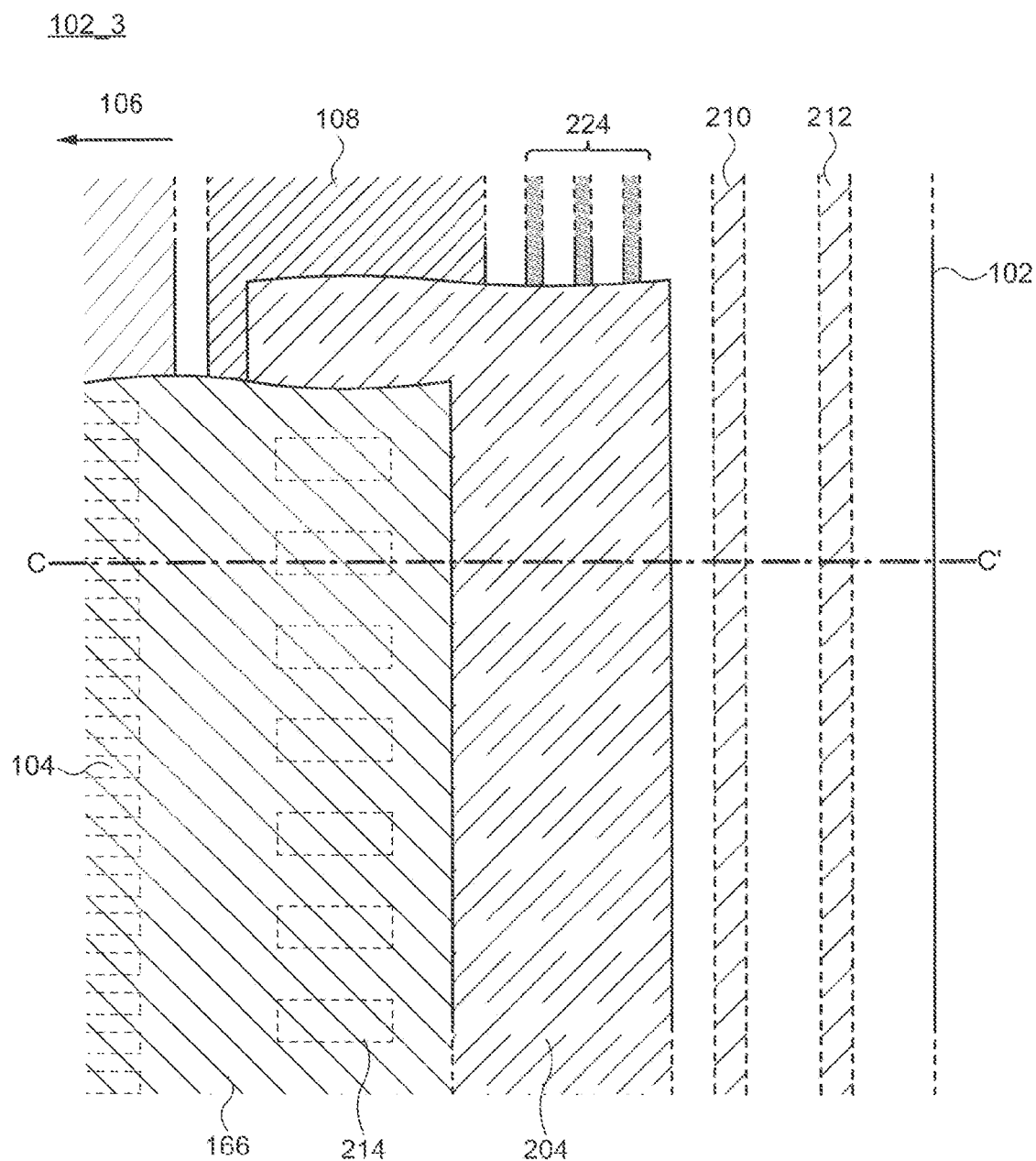
FIG. 9 is a schematic top view of a display device according to an embodiment of the present invention.
Figure 10:
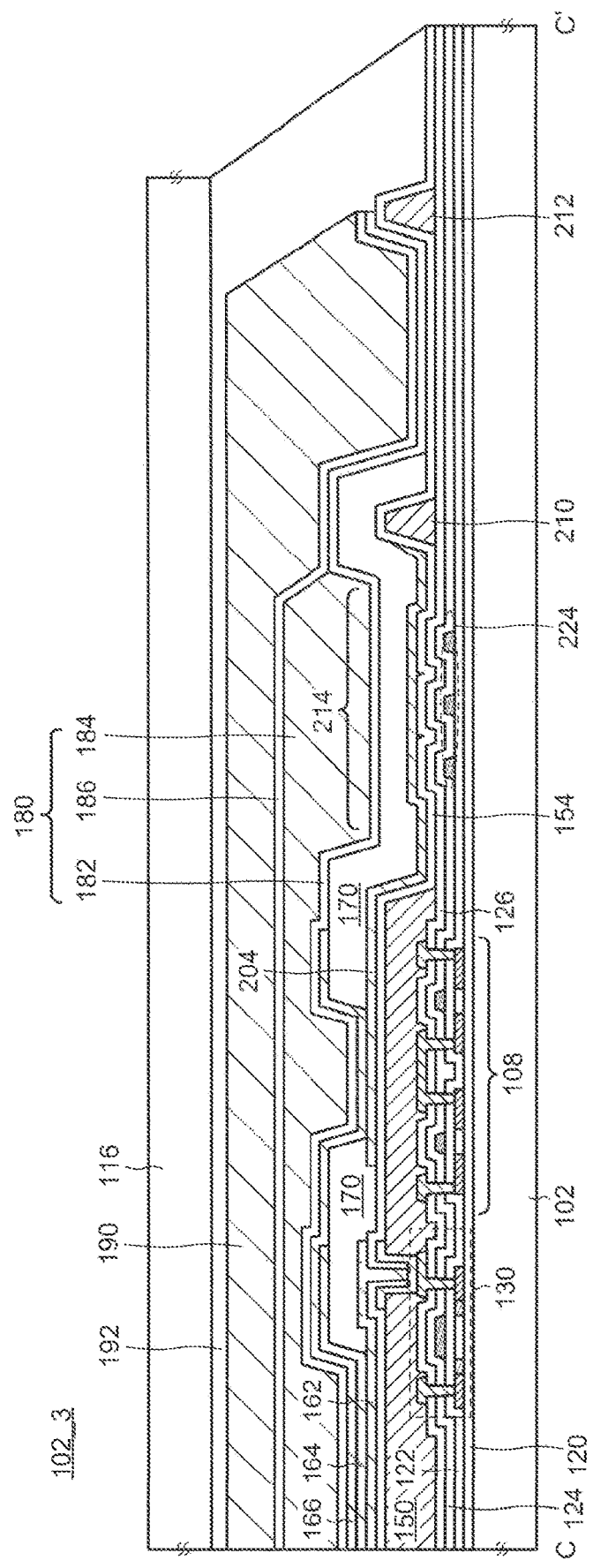
FIG. 10 is a schematic cross-sectional view of a display device according to an embodiment of the present invention.

Schematic top views of the regions 102_2 and 102_3 are shown in FIG. 7 and FIG. 9, respectively. Schematic views of cross sections along a chain line B-B' in FIG. 7 and a chain line C-C' in FIG. 9 are shown in FIG. 8 and FIG. 10, respectively. As shown in these drawings, the gate-side driver circuits 108 are disposed in the peripheral region between the display region 106 and the long sides of the substrate 102, and wirings 224 for supplying a variety of signals to the gate-side driver circuits 108 are arranged between the gate-side driver circuit 108 and the edge portion of the substrate 102. An example is shown in FIG. 7 to FIG. 10 in which the wirings 224 exist in the same layer as the gate electrode 134. However, the wirings 224 may exist in the same layer as the source/drain electrodes 136 and 138.

Similar to the structure of the peripheral region and the display region 106 close to the upper side of the substrate 102, the leveling film 150 extends from the display region 106 to the peripheral region and covers the gate-side driver circuits 108. The first dam 210 existing in the same layer as the leveling film 150 and the second dam 212 surrounding the first dam 210 are further provided in the peripheral region. The third interlayer film 154 covers the first dam 210 and the second dam 212.

The auxiliary wiring 204 existing in the same layer as the pixel electrode 162 is formed over the leveling film 150. The auxiliary wiring 204 is selectively disposed in the region surrounded by the first dam 210. As shown in FIG. 8 and FIG. 10, the auxiliary wiring 204 may overlap with the gate-side driver circuits 108 and the wirings 224.

The partition wall 170 possesses the openings exposing the pixel electrodes 162 as well as the openings 214 for electrical connection between the opposing electrode 166 and the auxiliary wiring 204. As described above, it is not always necessary to form the plurality of openings 214, and electrical connection may be achieved by one opening 214 extending in a direction parallel to the long side of the substrate 102. The partition wall 170 covers the edge portions of the pixel electrodes 162 in the display region 106 and covers the first edge portion and the second edge portion of the auxiliary wiring 204 and the first dam 210 in the peripheral region.

The passivation film 180 is selectively formed in the region surrounded by the first dam 210. In addition, the resin layer 190 is selectively provided in the region surrounded by the second dam 212. Thus, the passivation film 180 can be protected by the resin layer 190 during etching using the resin layer 190 as a mask, by which high reliability can be provided to the display device 100.

3-3. Structure of Lower Side of Substrate

The structure of the peripheral region and the display region 106 (region 102_4 in FIG. 1) close to a lower side of the substrate 102, that is, the side (also referred to as a fourth side) along which the terminals 112 are arranged, is explained below. An explanation of the structure the same as those described above may be omitted.

Figure 11:
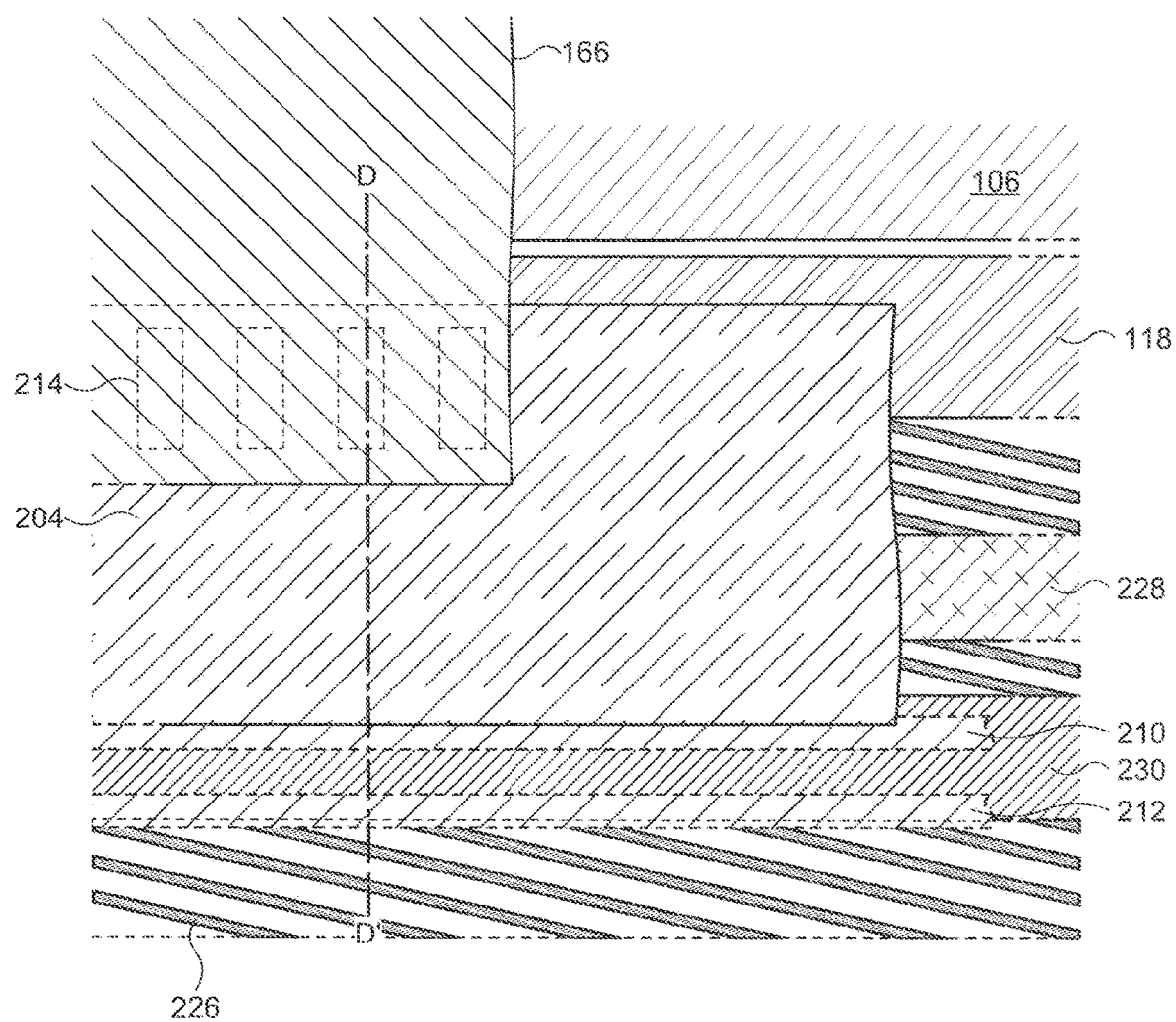
FIG. 11 is a schematic cross-sectional view of a display device according to an embodiment of the present invention.
Figure 12:
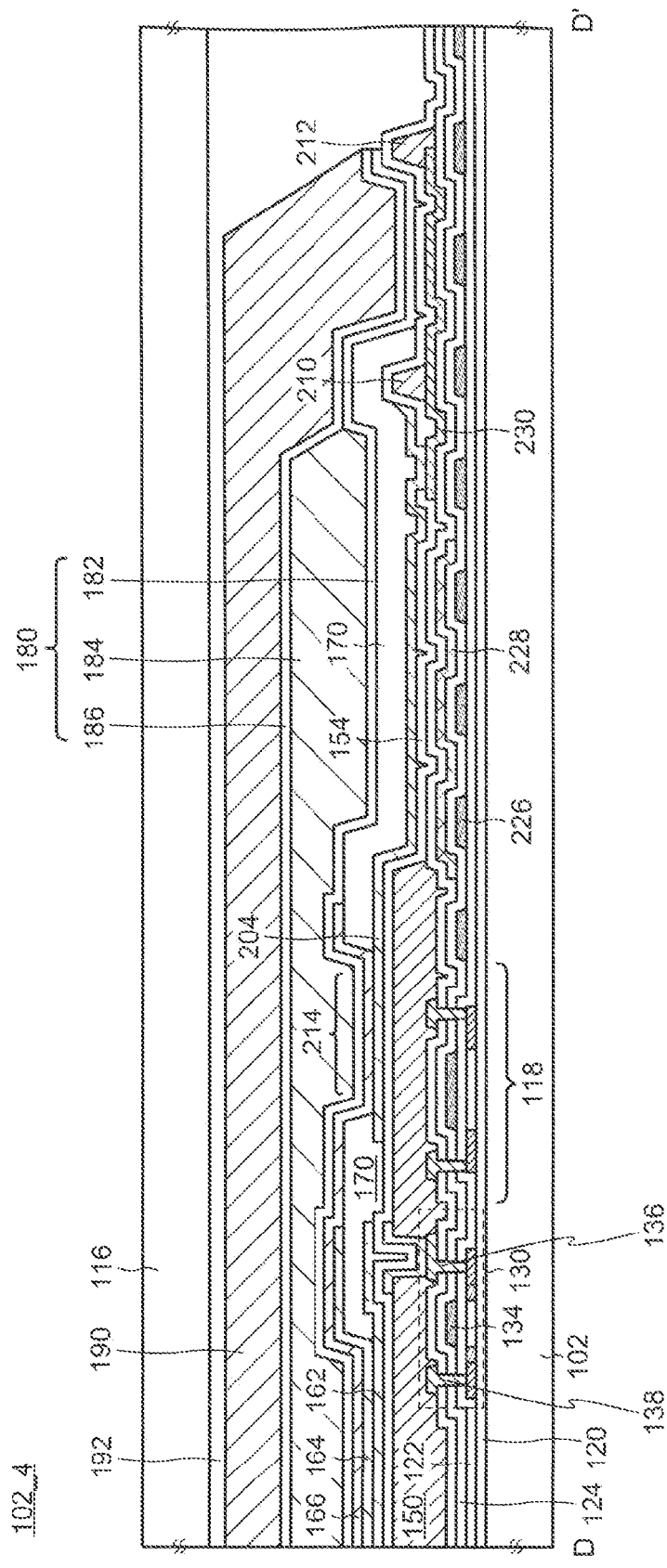
FIG. 12 is a schematic cross-sectional view for explaining a manufacturing method of a display device according to an embodiment of the present invention.

A schematic top view of the region 102_4 and a schematic view of a cross section along a chain line D-D' in FIG. 11 are shown in FIG. 11 and FIG. 12, respectively. As shown in FIG. 11, the source-side driver circuit 118 including analogue switches and the like is disposed between the display region 106 and the lower side, and wirings 226 extend from the source-side driver circuit 118 to the terminals 112. As shown in FIG. 11, the wirings 226 may be arranged so as to incline from the long side and short side of the substrate 102. Image signals are supplied to the pixels 104 through the wirings 226. As shown in FIG. 12, the wirings 226 exist in the same layer as the gate electrode 134 in the example shown in FIG. 11. However, the wirings 220 may be formed with a layer which is the same as the source/drain electrodes 136 and 138.

Wirings 228 and 230 are further provided in the peripheral region. There is no limitation to the function and usage of these wirings 228 and 230, and the wirings 228 and 230 each may be used as a wiring for supplying a potential to the pixel electrodes 162 and the opposing electrode 166, a wiring for supplying an initialization potential to each pixel 104, or a wiring for supplying signals for controlling the driver circuits. Furthermore, the wirings 228 and 230 may be formed in the same layer as the source/drain electrode 136 and 138 or may be formed between the first interlayer film 124 and the second interlayer film 126 as long as the wirings 228 and 230 are in a layer different from the wirings 226. In the example shown in FIG. 11 and FIG. 12, the wiring 228 is disposed between the first interlayer film 124 and the second interlayer film 126. On the other hand, the wiring 230 is formed by using the layer the same as the source/drain electrodes 136 and 138, is electrically connected to the auxiliary wiring 204, and supplies a constant potential to the opposing electrode 166.

Similar to the structure of the peripheral region and the display region 106 close to the upper side of the substrate 102, the leveling film 150 extends from the display region 106 to the peripheral region and covers the source-side driver circuit 118. The first dam 210 existing in the same layer as the leveling film 150 and the second dam 212 surrounding the first dam 210 are arranged in the peripheral region.

The auxiliary wiring 204 existing in the same layer as the pixel electrodes 162 is formed over the leveling film 150. The auxiliary wiring 204 is selectively provided in the region surrounded by the first dam 210. As shown in FIG. 11 and FIG. 12, the auxiliary wiring 204 may overlap with the source-side driver circuit 118, wirings 226, and the wiring 228. The auxiliary wiring 204 is electrically connected to the wiring 230 through an opening formed in the third interlayer film 154 in the region surrounded by the leveling film 150 and the first dam 210. The wiring 230 is applied with a constant potential, thereby supplying a constant potential to the opposing electrode 166.

The partition wall 170 possesses the openings for exposing the pixel electrodes 162 in the display region 106 as well as the openings 214 for electrical connection between the opposing electrode 106 and the auxiliary wiring 204. As described above, it is not always necessary to form the plurality of openings 214, and one opening 214 extending in a direction parallel to the lower side of the substrate 102 may be provided. The partition wall 170 covers the edge portions of the pixel electrodes 162 in the display region 106 and covers the first edge portion and the second edge portion of the auxiliary wiring 204 and the first dam 210 in the peripheral region.

The passivation film 180 is selectively formed in the region surrounded by the first dam 210. Additionally, the resin layer 190 is selectively formed in the region surrounded by the second dam 212. Hence, the passivation film 180 can be protected by the resin layer 190 during etching using the resin layer 190 as a mask, by which high reliability can be provided to the display device 100.

Figure 13:
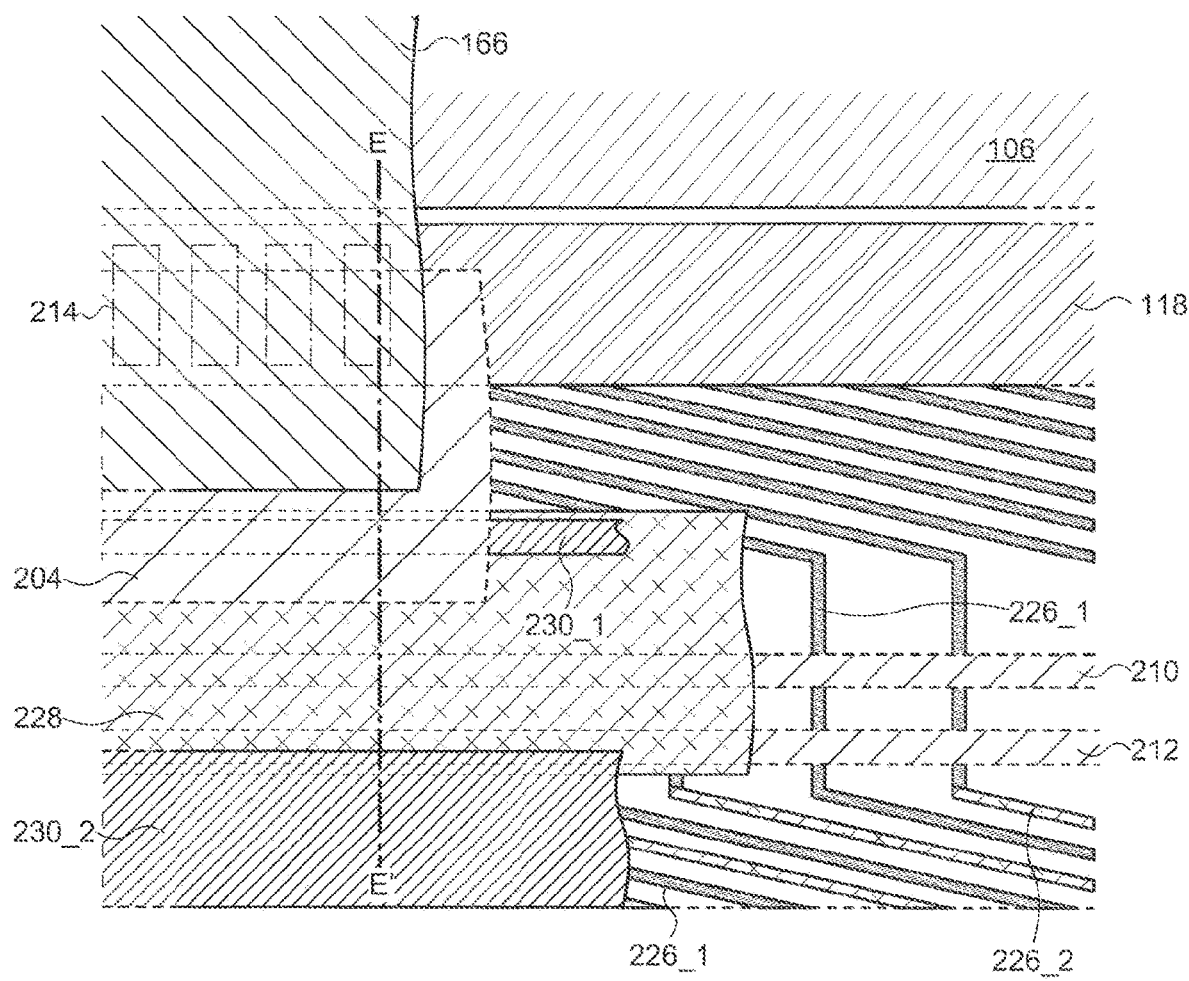
FIG. 13 is a schematic cross-sectional view of a display device according to an embodiment of the present invention.
Figure 14:
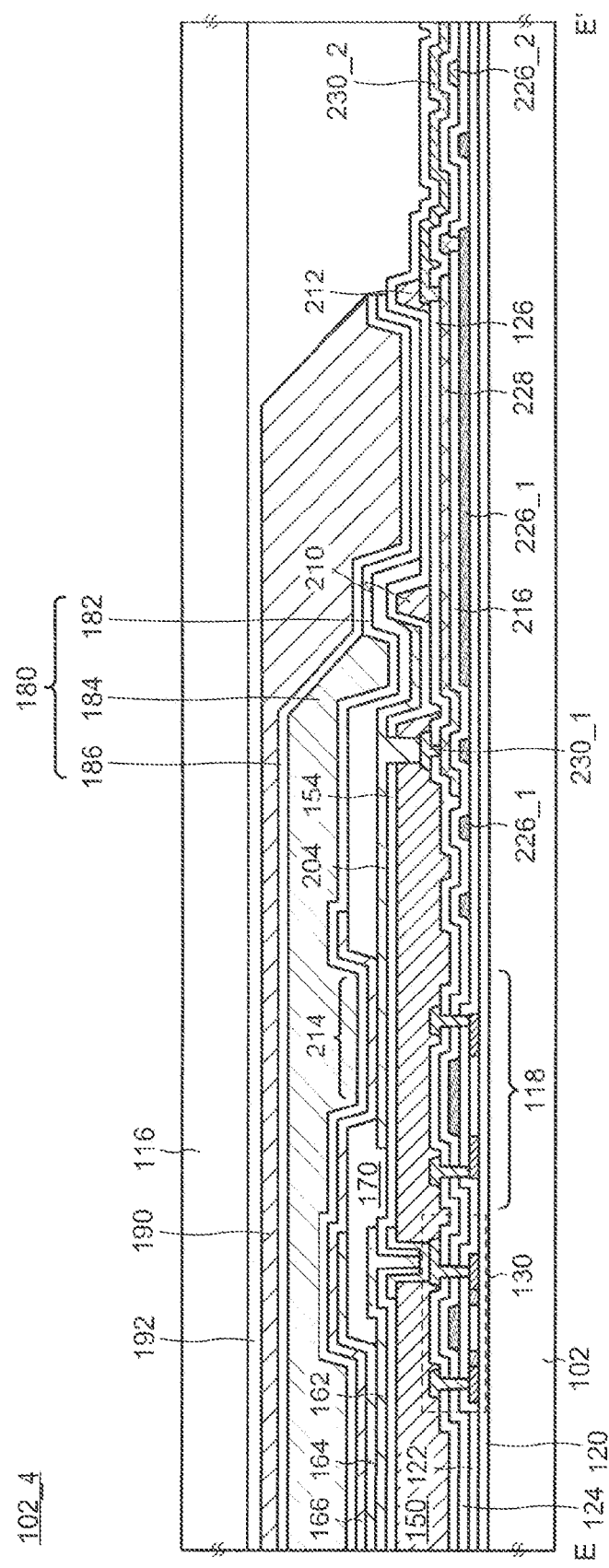
FIG. 14 is a schematic cross-sectional view of a display device according to an embodiment of the present invention.

FIG. 13 and FIG. 14 show an example in which a part of the wirings 226 exists in the same layer as the gate electrode 134 (that is, between the gate insulating film 122 and the first interlayer film 124) and another part thereof is included between the first interlayer film 124 and the second interlayer film 126. FIG. 13 is a schematic top view of the region 102_4, and FIG. 13 is a schematic view of a cross section along a chain line E-E' in FIG. 13.

As shown in FIG. 13, wirings 226_1 existing in the same layer as the gate electrode 134 extend from the source-side driver circuit 118 in a direction inclined from the long side and the short side of the substrate 102. Each of the wirings 226_1 bends in the peripheral region and possesses a portion substantially parallel to the long side. In addition, these wirings 226_1 are alternately connected to wirings 226_2 existing between the first interlayer film 124 and the second interlayer film 126. The wirings 226_2 also extend in a direction inclined from the long side and the short side of the substrate 102.

The potential supplied to the opposing electrode 166 is provided to a wiring 230_2 existing in the same layer as the source/drain electrodes 136 and 138. The wiring 230_2 may be arranged so as to overlap with the wirings 226_1 and 226_2. The wirings 226_1 and 226_2 alternate with each other under the wiring 230_2. The wiring 230_2 is electrically connected to the wiring 228 arranged between the first interlayer film 124 and the second interlayer film 126 through an opening formed in the second interlayer film 126. The wiring 228 is further connected to a wiring 230_1 existing in the same layer as the source/drain electrodes 136 and 138 through an opening formed in the second interlayer film 126. The wiring 230_1 is connected to the auxiliary wiring 204 in an opening formed in the leveling film 150 and the third interlayer film 154.

In the example shown in FIG. 13 and FIG. 14, the first dam 210 and the second dam 212 are disposed so as to overlap with the wiring 228. However, the positional relationship of the first dam 210 and the second dam 212 is not limited thereto. In this example, the passivation film 180 is also selectively formed in the region surrounded by the first dam 210, and the resin layer 190 is selectively formed in the region surrounded by the second dam 212. Hence, high reliability can be provided to the display device 100.

As can be understood from FIG. 1 and the structures of the peripheral regions close to the first to fourth sides, the auxiliary wiring 204 possesses a closed shape surrounding the display region 106 and is electrically connected to the opposing electrode 166. Moreover, since the auxiliary wiring 204 may have the same stacked-layer structure as the pixel electrodes 162 as described above, the auxiliary wiring 204 possesses a sufficiently low electrical resistance. Hence, even if sheet resistance of the opposing electrode 166 is high, a potential can be evenly applied to the opposing electrode 166. As a result, irregularity in luminance does not occur in the display region 106, allowing the display device 100 to provide a high-quality image.

Second Embodiment

In the present embodiment, a manufacturing method of the display device 100 is explained while illustratively showing the peripheral region and the display region 106 close to the first side. An explanation of the structure the same as that of the First Embodiment may be omitted.

FIG. 15A demonstrates a state where the undercoat 120, the transistor 130, and the wirings 220 and 222 are formed over the substrate 102. An explanation is omitted because these elements can be fabricated with widely known materials and methods. From this state, the leveling film 150 in addition to the first dam 210 and the second dam 212 is formed over the transistor 130 and the wirings 220 and 222. Specifically, a monomer or oligomers of the polymer material described in the First Embodiment are applied over the transistor 130 and the wirings 220 and 222 with a wet-type film-formation method such as a spin-coating method, a printing method, and an ink-jet method (FIG. 15B) and subjected to exposure through a photomask, and then development is performed. Heating may be conducted after exposure to further induce curing of the monomer or oligomers. With this process, the leveling film 150 having the opening for exposing the source/drain electrode 138, the first dam 210, and the second dam 212 are formed (FIG. 16A).

Figure 16A:
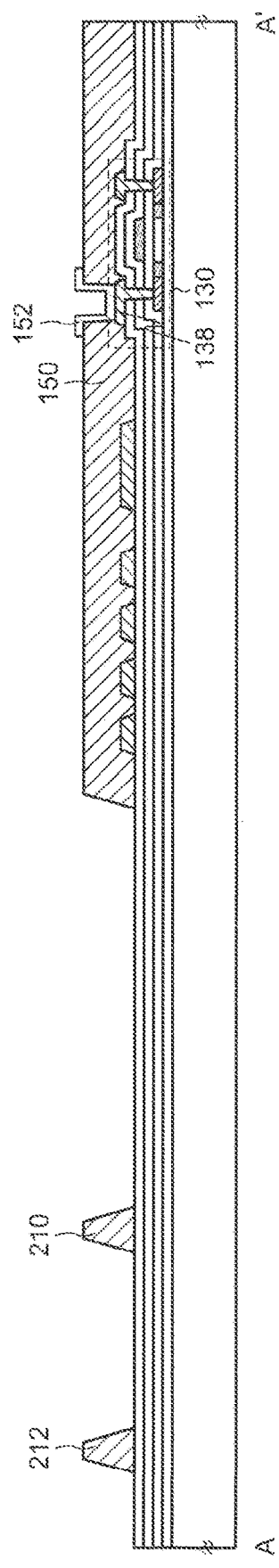
FIG. 16A and FIG. 16B are schematic cross-sectional views for explaining a manufacturing method of a display device according to an embodiment of the present invention.

After that, the connection electrode 152 covering the opening and in contact with the source/drain electrode 138 is formed (FIG. 16A). The connection electrode 152 may include a conductive oxide having a light-transmitting property, such as ITO and IZO, and may be formed by applying a sputtering method, for example.

Figure 16B:
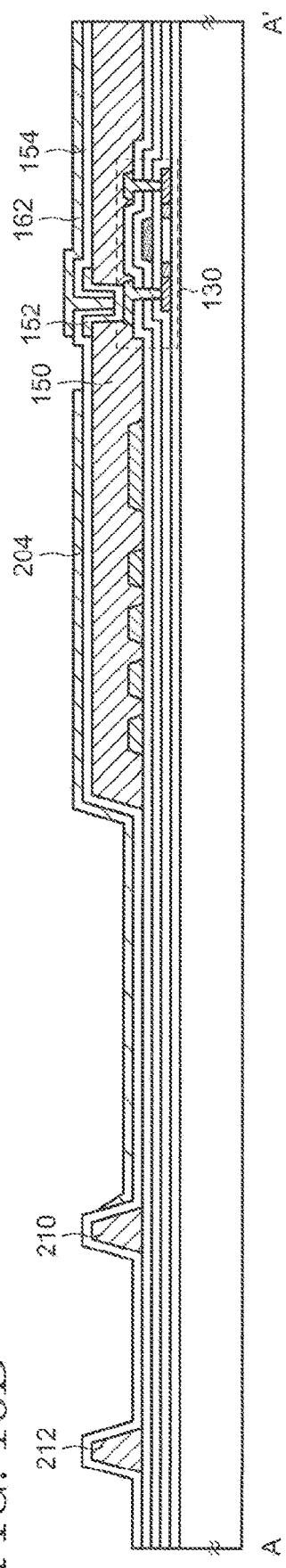

Next, the third interlayer film 154 is formed so as to cover the leveling film 150, the first dam 210, and the second dam 212. The third interlayer film 154 is formed with a sputtering method or a chemical vapor deposition (CVD) method. After that, etching is conducted on the third interlayer film 154 to prepare the opening exposing a top surface of the connection electrode 152 (FIG. 16B). The opening (see FIG. 2A) for direct contact of the leveling film 150 with the partition wall 170 may be simultaneously formed.

After that, the pixel electrode 162 and the auxiliary wiring 204 are simultaneously formed. When the pixel electrode 162 and the auxiliary wiring 204 have the stacked-layer structure shown in FIG. 2B, the first conductive layer 162_1 is formed by sputtering a conductive oxide having a light-transmitting property, the second conductive layer 162_2 including a metal such as silver and aluminum is formed with a sputtering method or a CVD method, and then the third conductive layer 162_3 is formed by sputtering a conductive oxide having a light-transmitting property, for example. After that, etching is performed so that the pixel electrode 204 and the auxiliary wiring 204 are physically separated from each other, resulting in the formation of the pixel electrode 162 and the auxiliary wiring 204 (FIG. 16B).

Next, the partition wall 170 is prepared. Specifically, a monomer or oligomers serving as a raw material of a polymer such as an epoxy resin, an acrylic resin, or a polyimide are applied with a wet-type film-formation method, and exposure and development are conducted, by which the partition wall 170 is fabricated (FIG. 17A). A photomask is designed so that the opening exposing the pixel electrode 162 and the opening exposing the auxiliary wiring 204 are formed in the partition wall 170. As described in the First Embodiment, the partition wall 170 covers the edge portions of the pixel electrodes 162, the first edge portion and the second edge portion of the auxiliary wiring 204, and the first dam 210. As shown in FIG. 17A, it is preferred that an edge portion of the opening of the partition wall 170 have a tapered shape.

Next, the organic layer 164 is formed so as to cover the partition wall 170 and the pixel electrode 162 (FIG. 17A). The organic layer 164 may be formed by applying an evaporation method or a wet-type film-formation method. After that, the opposing electrode 166 is formed so as to cover the organic layer 164 and be in contact with the auxiliary wiring 204 in the opening 214 (FIG. 17B). The opposing electrode 166 may also be prepared with an evaporation method or a sputtering method. Through these processes, the light-emitting element 160 is fabricated.

After that, the passivation film 180 is formed. Specifically, the first layer 182 is first formed by using a sputtering method or a CVD method so as to cover the partition wall 170 overlapping with the opposing electrode 166 and the shielding region 156_1, the first dam 210, and the second dam 212 as shown in FIG. 18A. At this time, the first layer 182 is also formed over the terminals 112. The second layer 184 is next formed over the first layer 182. The second layer 184 can be formed by applying a monomer or oligomers serving as a raw material of a polymer material such as an epoxy region or an acrylic resin and then curing the monomer or oligomers. Alternatively, the second layer 184 may be prepared by atomizing or gasifying the monomer or oligomers under a reduced pressure, spraying the first layer 182 with the monomer or oligomers, and then polymerizing the monomer or oligomers.

At this time, it is possible to selectively apply the monomer or oligomers in the region surrounded by the first dam 210 due to the first dam 210 as well as the projection of the partition wall 170 caused by the first dam 210. Namely, it is possible to prevent the monomer or oligomers from flowing to the outside of the shielding region 156_2 and the first dam 210. As a result, the second layer 184 can be selectively formed in the region surrounded by the first dam 210.

Next, the third layer 186 is formed so as to cover the second layer 184, the first dam 210, and the second dam 212. The third layer 186 can be formed with the same method as that of the first layer 182. The third layer 186 is also formed so as to overlap with the terminals 112. With this procedure, the second layer 184 can be sealed by the first layer 182 and the third layer 186.

Next, the resin layer 190 is formed. The resin layer 190 is formed by applying a monomer or oligomers serving as a raw material of the polymer material described in the First Embodiment with a wet-type film-formation method, and then exposing and curing the monomer and oligomers. At this time, the monomer or oligomers can be selectively applied in the region surrounded by the second dam 212 due to the second dam 212 as well as the projection of the first layer 182 and the third layer 186 caused by the second dam 212 (FIG. 18B). In other words, the resin layer 190 is selectively formed in the region surrounded by the second dam 212. After that, etching (e.g., dry etching) is performed using the resin layer 190 as a mask to remove the first layer 182 and the third layer 186 formed over the terminals 112 and expose the terminals 112. At this time, as shown in FIG. 18B, the first layer 182 and the third layer 186 which are not covered by the resin layer 190 are also removed in the vicinity of the first side, by which the position of the edge portion of the passivation film 180 is determined. Therefore, a bottom side of the side surface of the resin layer 190 matches an upper surface of the sidewall of the third layer 186. Moreover, a side surface of the first layer 182 and a side surface of the third layer 186 can exist in the same plane.

After that, the adhesive layer 192 is formed by using an acryl-based, epoxy-based, or acrylate-based adhesive, for example, and the opposing substrate 116 is fixed over the resin layer 190. The adhesive layer 192 may be formed so as to cover the side surface of the resin layer 190 (FIG. 4). Through the processes described above, the display device 100 is manufactured.

As described above, since the resin layer 190 is formed with a wet-type film-formation method, the position of the edge portion thereof is not always readily controlled precisely. therefore, if the resin layer 190 does not entirely cover the passivation film 180 and the passivation film 180 is partly exposed from the resin layer 190, the passivation film 180 is damaged in the following etching process, which allows impurities such as water and oxygen to enter the display region 106 through the second layer 184 having relatively high hydrophilicity. As a result, the light-emitting element 160 deteriorates, and reliability of the display device 100 decreases.

However, spreading of the monomer or oligomers giving the second layer 184 is restricted by the first dam 210 because the second layer 184 is sealed by the first layer 182 and the third layer 186 as described above. Hence, the second layer 184 is selectively formed in the region surrounded by the first dam 210. Similarly, spreading of the monomer or oligomers giving the resin layer 190 is restricted by the second dam 212, which allows the selective formation of the resin layer 190 in the region surrounded by the second dam 212. Accordingly, the stacked-layer structure of the first layer 182, the second layer 184, and the third layer 186 is covered by the resin layer 190 and is not exposed from the resin layer 190. Thus, the stacked-layer structure of the first layer 182, the second layer 184, and the third layer 186 is not damaged in the etching process to expose the terminals 112, and the high sealing function of the passivation film 180 is not lost. As a result, high reliability can be provided to the display device 100.

Third Embodiment

Figure 6:
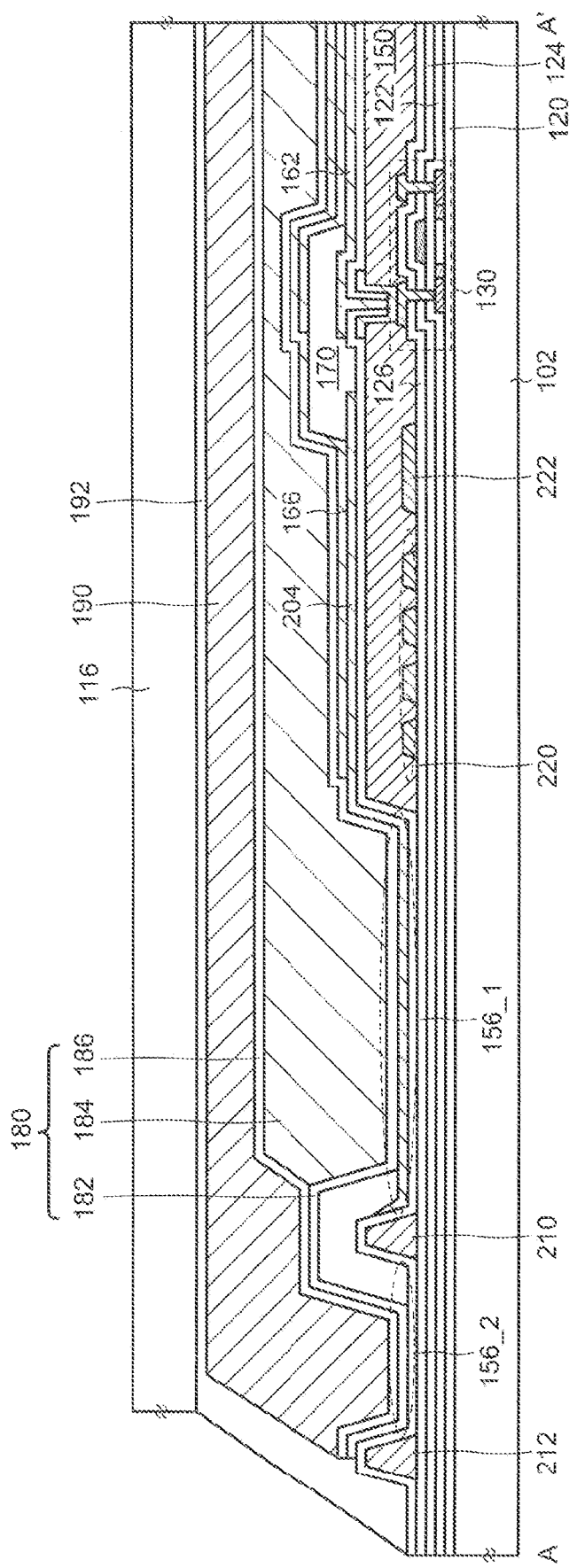
FIG. 6 is a schematic cross-sectional view of a display device according to an embodiment of the present invention.
Figure 19:
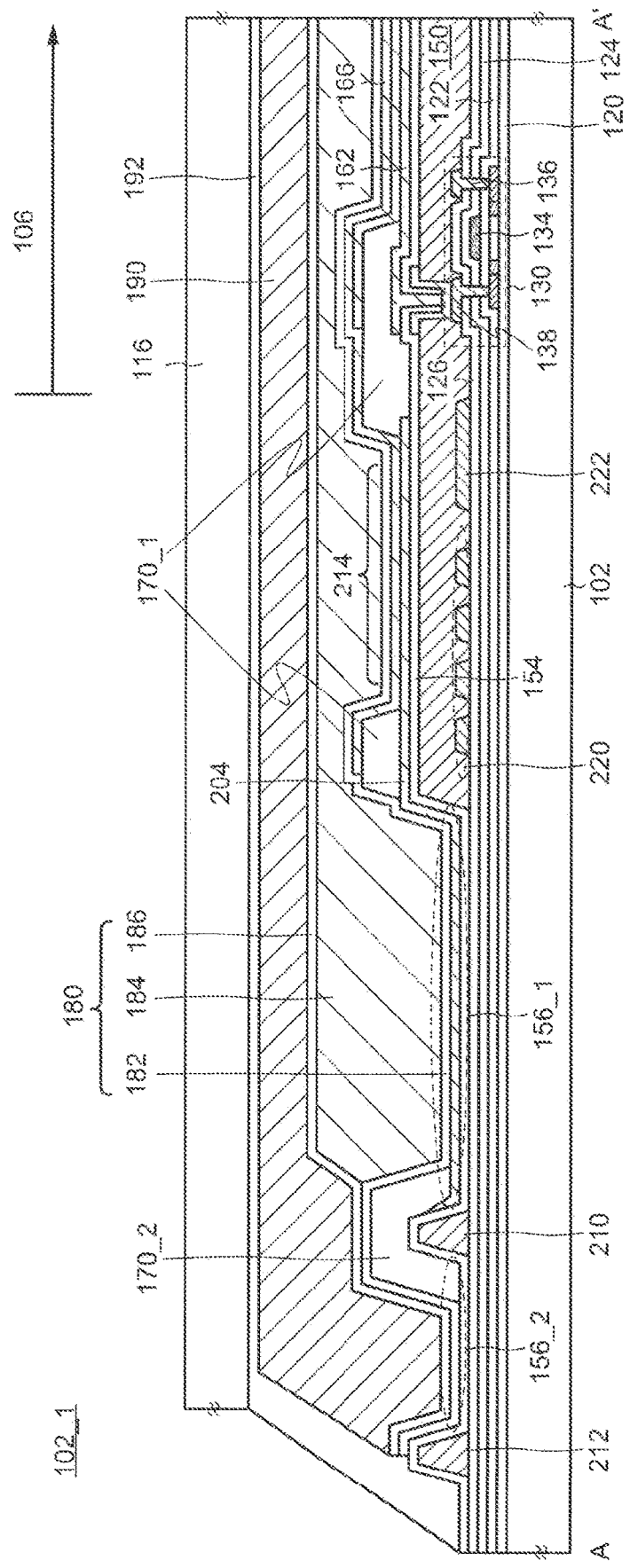
FIG. 19 is a schematic cross-sectional view of a display device according to an embodiment of the present invention.
Figure 20:
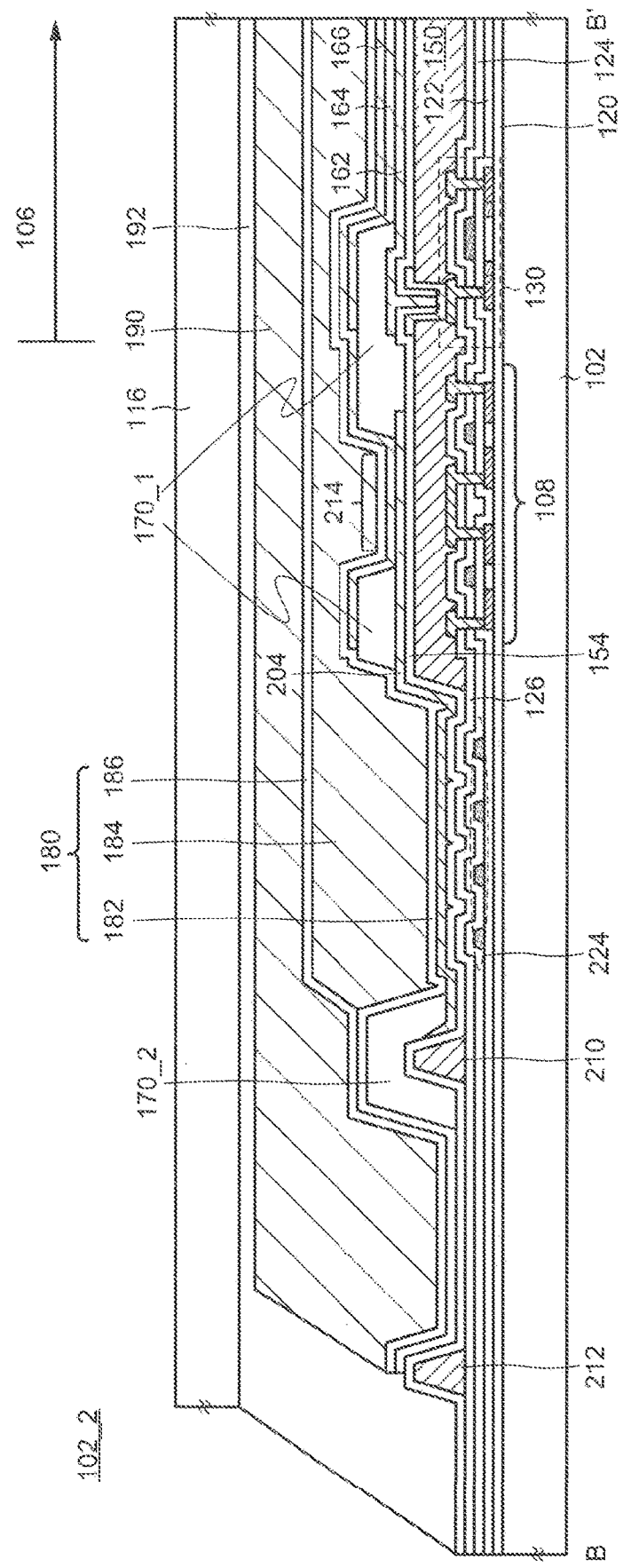
FIG. 20 is a schematic cross-sectional view of a display device according to an embodiment of the present invention.

In the present embodiment, a modified example of the display device 100 is explained. Schematic cross-sectional views of the regions 102_1, 102_2, and 102_4 are illustrated in FIG. 19, FIG. 20, and FIG. 21, respectively. As shown in these drawings, the structure of the modified example is different from that of the display device 100 in that the partition wall 170_2 covering the first dam 210 is spaced from the partition wall 170_1 covering the edge portions of the pixel electrodes 162. The partition wall 170_1 has the opening 214 exposing the auxiliary wiring 204, and the auxiliary wiring 204 is electrically connected to the opposing electrode 166 through this opening. Similar to the display device 100 shown in FIG. 6, the auxiliary wiring 204 is in contact with the first layer 182 in the shielding region 156_1.

Figure 22A:
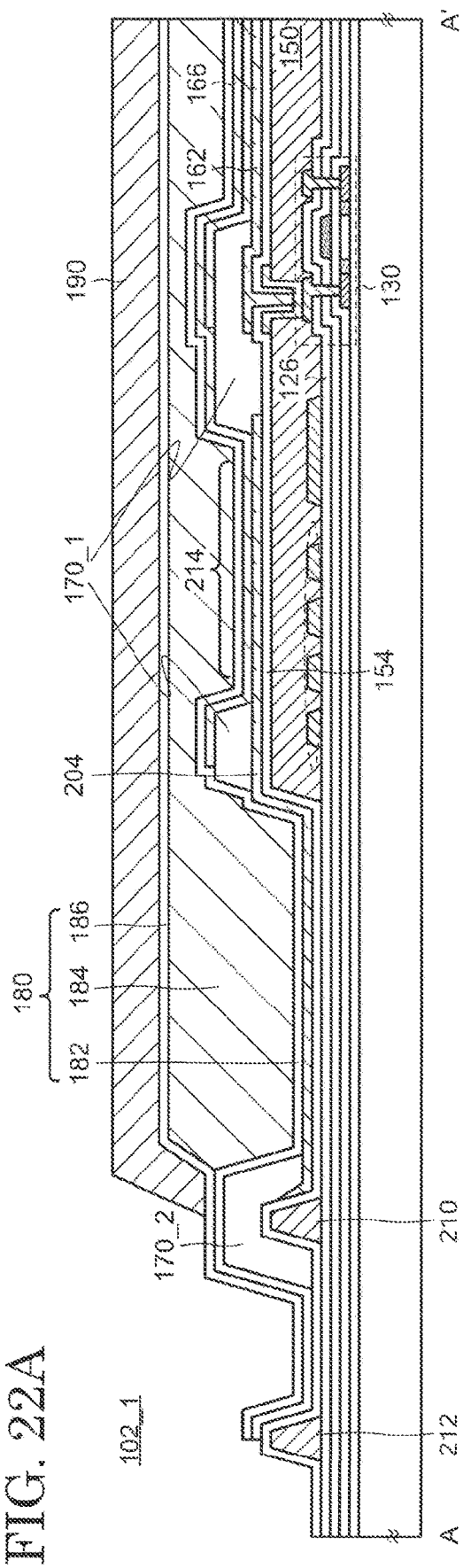
FIG. 22A and FIG. 22B are schematic cross-sectional views for explaining a manufacturing method of a display device according to an embodiment of the present invention.
Figure 22B:
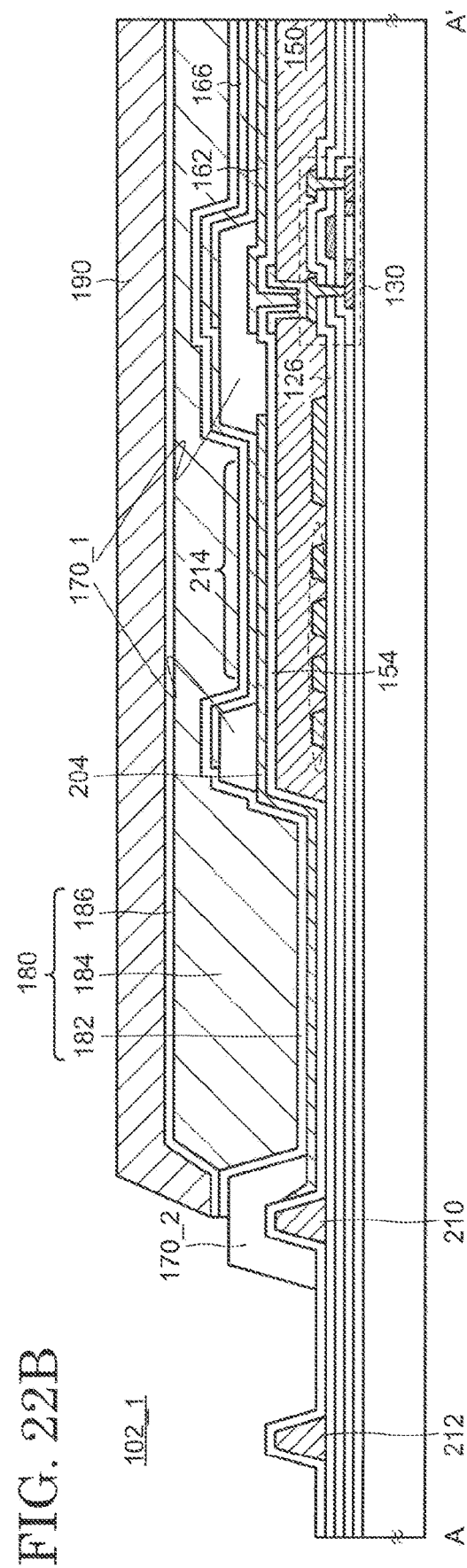

In a case where viscosity of the monomer or oligomers giving the resin layer 190 or viscosity of a mixture including the monomer or oligomers is extremely high or in a case where an amount of the monomer or oligomers to be applied is insufficient, the resin layer 190 may not be able to cover the edge portion of the passivation film 180 (FIG. 22A). In this case, as shown in FIG. 22B, the edge portion of the passivation film 180 is etched, and the portion of the passivation film 180, which is not covered by the resin layer 190, is lost in the following etching process so that the partition wall 170_2 is exposed. However, there is no route for transporting impurities such as water and oxygen to the partition wall 170_2 in the modified example explained in the present embodiment because the partition wall 170_2 is spaced from the partition wall 170_1 in contact with the light-emitting elements 160. As a result, the influence of impurities on the light-emitting element 160 is negligible, and reliability of the display device 100 can be secured.

Fourth Embodiment

Figure 23:
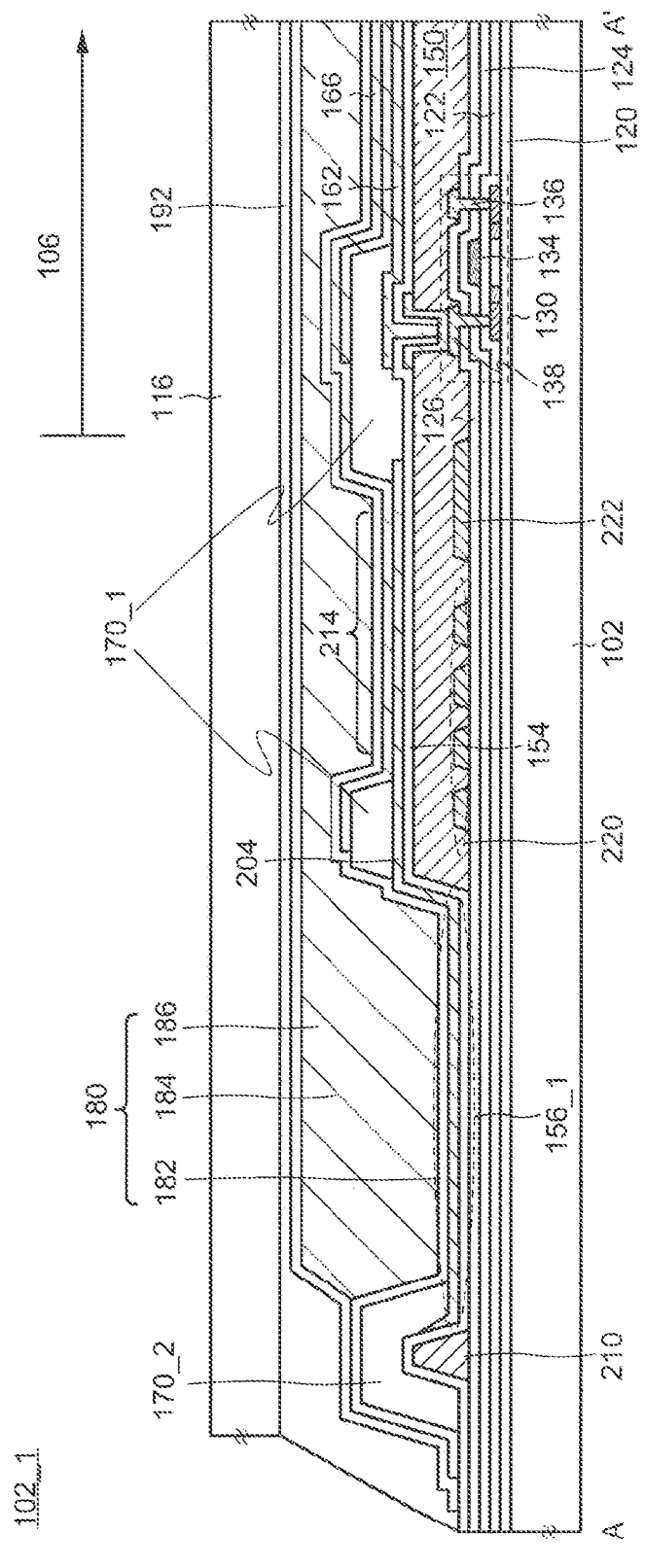
FIG. 23 is a schematic cross-sectional view of a display device according to an embodiment of the present invention.
Figure 24:
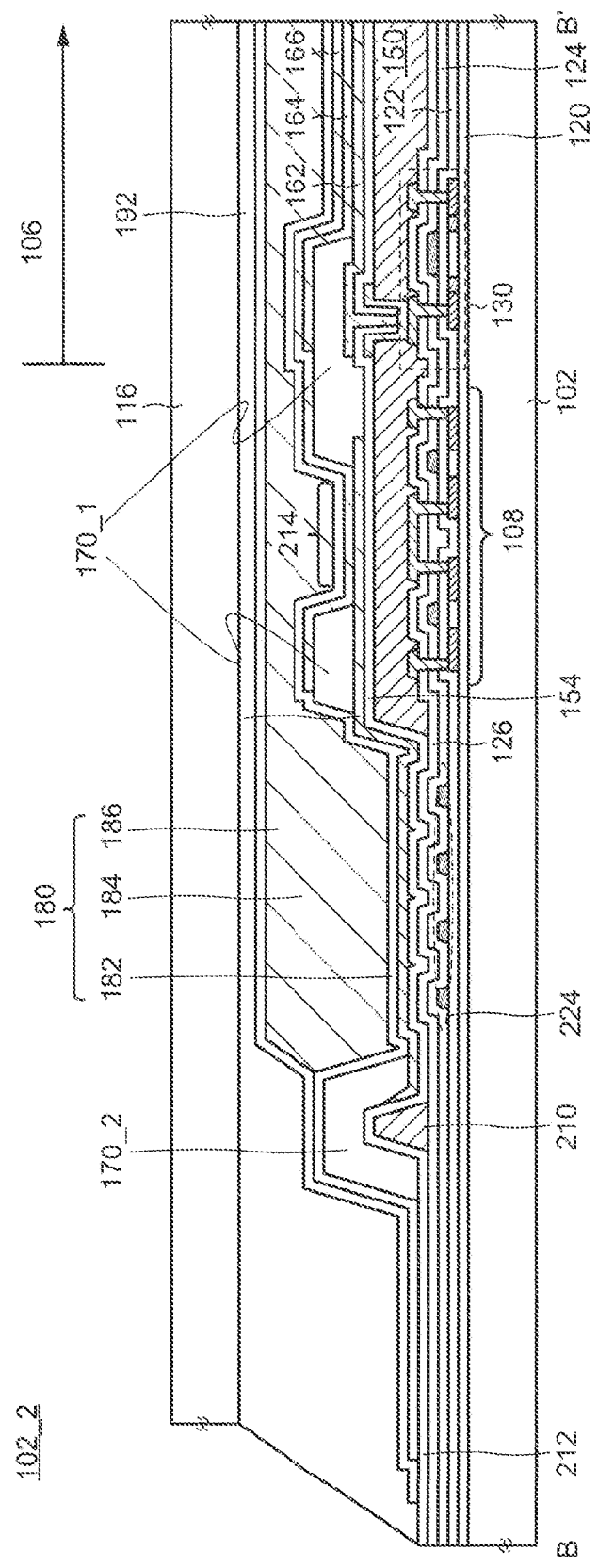
FIG. 24 is a schematic cross-sectional view of a display device according to an embodiment of the present invention.
Figure 25:
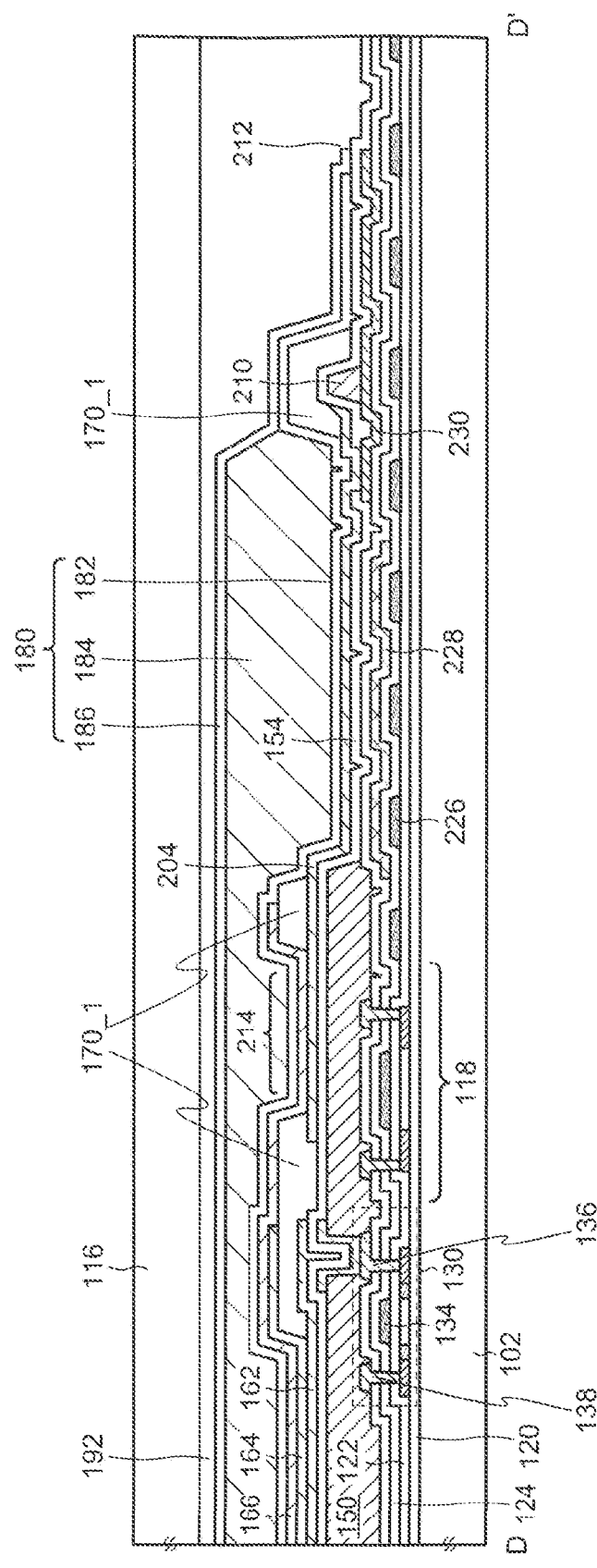
FIG. 25 is a schematic cross-sectional view of a display device according to an embodiment of the present invention.

In the present embodiment, a modified example of the display device 100 is explained. Schematic cross-sectional views of the regions 102_1, 102_2, and 102_4 are illustrated in FIG. 23, FIG. 24, and FIG. 25, respectively. As shown in these drawings, the present modified example is different from the display device 100 and the modified example explained in the Third Embodiment in that a single dam (first dam 210) is provided in the peripheral region. In this case, it is preferred that the first layer 182 and the third layer 186 be prepared by applying a sputtering method while covering the terminals 112 with a mask. In the present modified example, the etching process of the first layer 182 and the third layer 186 is not necessary, and it is not necessary to form the second dam 212 and the shielding region 156_2.

Hence, an area of the peripheral region can be reduced, and a display device having a display region 106 with a wide area can be manufactured.

The modes described above as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
   a substrate having a display region and a peripheral region surrounding the display region;
   a pixel over the display region, the pixel including:
      a pixel electrode;
      a first partition wall covering an edge of the pixel electrode;
      an organic layer over the pixel electrode; and
      an opposing electrode over the organic layer;
   a passivation film over the pixel, the passivation film including:
      a first layer containing an inorganic compound;
      a second layer over the first layer, the second layer containing an organic compound; and
      a third layer over the second layer, the third layer containing an inorganic compound;
   a dam over the peripheral region and surrounding the display region;
   a second partition wall continuously covering the dam from a first edge of the dam to a second edge of the dam opposite the first edge of the dam, the second partition wall being spaced away from the first partition wall;
   an insulating layer located between the dam and the second partition wall;
   at least one first wiring over the peripheral region and extending between the dam and an edge of the substrate; and
   a second wiring over the peripheral region, connected to the opposing electrode, and existing in the same layer as the pixel electrode,
   wherein an edge of the second wiring is located between the insulating layer and the second partition wall,
   the second wiring is not in direct contact with the dam,
   the second layer overlaps with the second partition wall in the plan view, and
   the second partition wall covers an edge of the second wiring.

2. The display device according to claim 1, further comprising:
   a third wiring located between the insulating layer and the substrate, the third wiring being in electrical contact with the opposing electrode via the second wiring,
   wherein, in a cross-sectional view,
   the third wiring includes a third edge and a fourth edge, and
   the insulating layer covers the third edge of the third wiring and the fourth edge of the third wiring.

3. The display device according to claim 1, further comprising:
   a third wiring located between the insulating layer and the substrate,
   wherein, in a cross-sectional view,
   the insulating layer includes a contact hole, and
   the third wiring is in electrical contact with the second wiring via the contact hole.

4. The display device according to claim 1,
   wherein, in a cross-sectional view,
   an edge of the second layer overlaps with the second wiring.

5. The display device according to claim 1, further comprising:
   a third wiring located between the insulating layer and the substrate, the third wiring being in electrical contact with the opposing electrode via the second wiring,
   wherein an edge of the second layer overlaps with the third wiring in a cross-sectional view.

6. The display device according to claim 1, further comprising:
   a third wiring located between the insulating layer and the substrate, the third wiring being in electrical contact with the opposing electrode via the second wiring,
   wherein, in a cross-sectional view,
   the third wiring includes a third edge and a fourth edge, the third edge being closer to the display region compared with the fourth edge, and
   the second layer overlaps with the third edge of the third wiring.

7. The display device according to claim 1, further comprising:
   a third wiring located between the insulating layer and the substrate, the third wiring being in electrical contact with the opposing electrode via the second wiring,
   wherein, in a cross-sectional view,
   the first edge of the dam is closer to the display region compared with the second edge of the dam,
   the third wiring includes a third edge and a fourth edge,
   the first edge of the dam is located between the third edge of the third wiring and the fourth edge of the third wiring, and
   the second edge of the dam is located between the third edge of the third wiring and an edge of the substrate.

8. The display device according to claim 1,
   wherein a part of the insulating layer is located between the pixel electrode and the dam.

9. The display device according to claim 1,
   wherein the dam does not overlap with the second wiring in the plan view.

10. A display device comprising:
    a substrate having a display region and a peripheral region surrounding the display region;
    a pixel over the display region, the pixel including:
       a pixel electrode;
       a first partition wall covering an edge of the pixel electrode;
       an organic layer over the pixel electrode; and
       an opposing electrode over the organic layer;

a passivation film over the pixel, the passivation film including:
  a first layer containing an inorganic compound;
  a second layer over the first layer, the second layer containing an organic compound; and
  a third layer over the second layer, the third layer containing an inorganic compound;
a dam over the peripheral region and surrounding the display region;
a second partition wall continuously covering the dam from a first edge of the dam to a second edge of the dam opposite the first edge of the dam, the second partition wall being spaced away from the first partition wall;
at least one first wiring over the peripheral region and extending between the dam and an edge of the substrate; and
a second wiring over the peripheral region connected to the opposing electrode and existing in the same layer as the pixel electrode,
wherein the second layer overlaps with the second partition wall in a plan view;
the second partition wall covers an edge of the second wiring, and
the dam does not overlap the second wiring in the plan view.

11. The display device according to claim 10, further comprising:
an insulating layer located between the dam and the second partition wall; and
a third wiring located between the insulating layer and the substrate, the third wiring being in electrical contact with the opposing electrode via the second wiring,
wherein, in a cross-sectional view,
the third wiring includes a third edge and a fourth edge, and
the insulating layer covers the third edge of the third wiring and the fourth edge of the third wiring.

12. The display device according to claim 10, further comprising:
an insulating layer located between the dam and the second partition wall; and
a third wiring located between the insulating layer and the substrate,
wherein, in a cross-sectional view,
the insulating layer includes a contact hole, and
the third wiring is in electrical contact with the second wiring via the contact hole.

13. The display device according to claim 10,
wherein an edge of the second layer overlaps with the second wiring in a cross-sectional view.

14. The display device according to claim 10, further comprising:
a third wiring located between the second wiring and the substrate, the third wiring being in electrical contact with the opposing electrode via the second wiring,
wherein an edge of the second layer overlaps with the third wiring in a cross-sectional view.

15. The display device according to claim 10, further comprising:
a third wiring located between the second wiring and the substrate, the third wiring being in electrical contact with the opposing electrode via the second wiring,
wherein, in a cross-sectional view,
the third wiring includes a third edge and a fourth edge, the third edge being closer to the display region compared with the fourth edge, and
the second layer overlaps with the third edge of the third wiring.

16. The display device according to claim 10, further comprising:
a third wiring located between the second wiring and the substrate, the third wiring being in electrical contact with the opposing electrode via the second wiring,
wherein, in a cross-sectional view,
the first edge of the dam is closer to the display region compared with the second edge of the dam,
the third wiring includes a third edge and a fourth edge,
the first edge of the dam is located between the third edge of the third wiring and the fourth edge of the third wiring, and
the second edge of the dam is located between the third edge of the third wiring and an edge of the substrate.

* * * * *